US010420984B2

(12) United States Patent
Bender et al.

(10) Patent No.: US 10,420,984 B2
(45) Date of Patent: *Sep. 24, 2019

(54) SPORT-BOOT PRESSURE MONITOR AND METHOD OF USE

(71) Applicants: Chris Norcross Bender, Reno, NV (US); Kay Daniel Vetter, Reno, NV (US)

(72) Inventors: Chris Norcross Bender, Reno, NV (US); Kay Daniel Vetter, Reno, NV (US)

(73) Assignee: Chris Norcross Bender, Reno, NV (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/138,835

(22) Filed: Sep. 21, 2018

(65) Prior Publication Data

US 2019/0022461 A1 Jan. 24, 2019

Related U.S. Application Data

(63) Continuation of application No. 15/710,647, filed on Sep. 20, 2017, now Pat. No. 10,080,921, which is a
(Continued)

(51) Int. Cl.
*G08B 21/00* (2006.01)
*A63B 24/00* (2006.01)
(Continued)

(52) U.S. Cl.
CPC ........ *A63B 24/0062* (2013.01); *A43B 3/0005* (2013.01); *A43B 3/0015* (2013.01);
(Continued)

(58) Field of Classification Search
CPC ....... A43B 3/0005; A43B 3/0021; A43B 5/04; A63B 2220/56; A63B 24/0062;
(Continued)

(56) References Cited

U.S. PATENT DOCUMENTS 5,877,687 A * 3/1999 Bernard ................ A63C 5/06
340/539.1
6,270,432 B1 * 8/2001 Matlock ............... A43B 3/0005
340/323 R
(Continued)

*Primary Examiner* — Mark S Rushing
(74) *Attorney, Agent, or Firm* — Holland & Hart LLP

(57) ABSTRACT

A sport-boot pressure monitoring system and method of use. The system includes a left boot sensor having a left flexible fluid-containing bladder shaped to fit between a user's left leg and an interior surface of a left boot worn by the user and a left pressure sense element in pressure-sensing communication with the left flexible fluid-containing bladder, a right boot sensor that is similar to the left one, and a controller to provide a pressure alert if pressure between one of the user's legs and the interior surface of the boot worn on that leg violates a predetermined pressure threshold and to provide a proximity alert if a distance between the left and right boots violates a predetermined proximity threshold.

6 Claims, 17 Drawing Sheets

Related U.S. Application Data continuation of application No. 15/230,250, filed on Aug. 5, 2016, now Pat. No. 9,770,624, which is a continuation-in-part of application No. 14/755,148, filed on Jun. 30, 2015, now abandoned, which is a continuation of application No. 13/652,421, filed on Oct. 15, 2012, now Pat. No. 9,078,485.

(60) Provisional application No. 61/547,614, filed on Oct. 14, 2011, provisional application No. 61/713,464, filed on Oct. 12, 2012.

(51) Int. Cl.

| | |
|---|---|
| *A43B 5/04* | (2006.01) |
| *A63B 69/18* | (2006.01) |
| *G01L 19/08* | (2006.01) |
| *G01L 19/12* | (2006.01) |
| *A43B 3/00* | (2006.01) |
| *G09B 19/00* | (2006.01) |
| *H04W 4/00* | (2018.01) |
| *A63C 11/00* | (2006.01) |
| *H04W 4/80* | (2018.01) |
| *A63B 71/06* | (2006.01) |

(52) U.S. Cl.
CPC ............. *A43B 3/0021* (2013.01); *A43B 5/04* (2013.01); *A43B 5/0415* (2013.01); *A63B 69/18* (2013.01); *A63C 11/003* (2013.01); *G01L 19/083* (2013.01); *G01L 19/12* (2013.01); *G09B 19/0038* (2013.01); *H04W 4/00* (2013.01); *A63B 2071/0625* (2013.01); *A63B 2220/56* (2013.01); *A63B 2220/833* (2013.01); *A63B 2225/50* (2013.01); *A63C 2203/18* (2013.01); *B81B 2201/0264* (2013.01); *H04W 4/80* (2018.02)

(58) Field of Classification Search
CPC ............... A63B 69/18; A63C 2203/18; B81B 2201/0264; G01L 19/12; G09B 19/0038
USPC .......................................................... 340/626
See application file for complete search history.

(56) References Cited

U.S. PATENT DOCUMENTS

2006/0248749 A1* 11/2006 Ellis ..................... A43B 3/0005
                                                                                  36/28
2007/0006489 A1* 1/2007 Case, Jr. .............. A43B 3/0005
                                                                                 36/132

* cited by examiner

SPORT-BOOT PRESSURE MONITOR AND METHOD OF USE

RELATED APPLICATIONS

This application is a continuation of U.S. application Ser. No. 15/710,647 filed Sep. 20, 2017, titled "Sport-Boot Pressure Monitor And Method Of Use," which is a continuation of U.S. application Ser. No. 15/230,250 filed Aug. 5, 2016, titled "Sport-Boot Pressure Monitor And Method Of Use," which is a continuation-in-part of U.S. application Ser. No. 14/755,148 filed Jun. 30, 2015, titled "Sport Performance Monitoring Apparatus, Process And Method Of Use," which is a continuation of Ser. No. 13/652,421 filed Oct. 15, 2012, titled "Sport performance monitoring apparatus including a flexible boot pressure sensor communicable with a boot pressure sensor input, process and method of use," issued Jul. 14, 2015 as U.S. Pat. No. 9,078,485, which in turn claims priority from U.S. Provisional Application Ser. No. 61/547,614 titled "Sport performance monitoring apparatus, process and method of use," filled Oct. 14, 2011, and U.S. Provisional Application Ser. No. 61/713,464 titled "Sport performance monitoring apparatus, process and method of use," filed Oct. 12, 2012, all of which applications are incorporated herein by this reference in their entirety, including the source code appendix of U.S. Provisional Application Ser. No. 61/713,464. It is to be understood, however, that in the event of any inconsistency between this specification and any information incorporated by reference in this specification, this specification shall govern.

COPYRIGHT NOTICE

A portion of the disclosure of this patent document contains or may contain material subject to copyright protection. The copyright owner has no objection to the photocopy reproduction of the patent document or the patent disclosure in exactly the form it appears in the Patent and Trademark Office patent file or records, but otherwise reserves all copyright rights.

FIELD OF INVENTION

The present invention relates to sport training devices. In one embodiment, pressure distribution and limb proximity can be monitored in real time.

BACKGROUND

A typical ski turn can be described as a collection of decision points starting with the point at which the skier decides to begin the turn. A cascade of other decisions and actions follow, all of them dependent on when that first decision was made.

To properly initiate a ski turn, varying degrees of forward pressure are exerted against the tongue of the ski boot. For example, in one common turn in ski racing, the skier first exerts neutral forward pressure, followed by increasing continual forward pressure in varying degrees. Proper timing and maintenance of forward pressure can, depending on skiing conditions, improve the shape of the turn, the control of the turn, the speed of the skier, the direction of the turn, the quickness of edge transitions and many other nuances of a ski turn. These factors apply in varying degrees to varying ski conditions and circumstances such as recreational, racing, powder, groomed, ice, and bump (mogul) skiing as well as many other types of skiing and ski conditions. Teaching and training proper form with respect to ski turns is particularly difficult due both to difficulty in externally observing forward or other pressure and ski proximity and to an inability to communicate the form break to the skier at the moment the problem occurs.

One mechanical strategy of attempting to compensate for improper pressure distribution and ski proximity involves changing the physical shape of the skis. Shaping the ski often makes skiing easier but it does not of itself solve the full range of issues that result from improper pressure distribution and ski proximity. For example, in ski racing, if the skier is not generating sufficient forward pressure, a turn can be initiated but the racer can lose edge control, skidding and losing speed through the race course. This loss of control in one turn can cause further loss of control in one or more subsequent turns and even complete loss of control and exit from the race course. The difference between a correct turn and a bad turn is often a direct result of whether the skier is applying sufficient forward pressure to the portions of the ski boots abutting the skier's lower shin and whether the skis are appropriately spaced, or in some cases such as bump skiing not spaced, from one another.

Various electronic systems have been provided to try to provide real-time feedback to the skier. These systems have typically used small, spot electronic sensors selectively positioned by the skier. These systems have proven to be inaccurate due to their small size and inability to detect leg pressure across the surface of the tongue of the ski boot.

Additional disadvantages of the use of electronic spot sensors include the cost of electronic sensors, the use of multiple sensors to obtain accurate monitoring in a single ski boot, frequent adjustment to the location of the sensors within the boot in order to obtain the most accurate monitoring, and compromised durability due to susceptibility to weather conditions and friction.

Yet another disadvantage of these electronic systems is that they have not provided any detection of ski proximity. In certain types of skiing conditions and in ski racing in particular, the feet should be sufficiently independent, and the hips should not be locked in position with respect to the legs and feet. Further, when the feet are sufficiently separated from each other, the skier can generate edge pressure without tilting the body to one side. If a skier is notified only of pressure distribution without also being notified of ski proximity, the skier can only generate adequate forward pressure by tilting into the turn compromising balance and increasing the risk of falling. The applicants have discovered that, since ski proximity is such an important part of proper turn execution and other aspects of skiing, the lack of proximity monitoring results in an incomplete solution to the training challenges surrounding proper ski turns and other aspects of skiing.

Another disadvantage of prior electronic methods is that many have not associated each sensor with a specific limb and therefore have not indicated to the skier which leg was failing by, for example, exceeding a given pressure threshold. Further, the absence of independent, limb-associated sensors has prevented the skier from being able to adjust sensitivity independently for each sensor. This has resulted in failure to adequately report improper pressure for one of the two legs. Prior systems for monitoring skier lean have also typically employed uncomfortable or cumbersome mountings to the ski boot, the ankle, or a combination of both ski boot and ankle. Many of these systems have required semi-permanent to permanent positioning within the ski boot, making maintenance and location adjustment difficult.

Yet another issue is variability of ski boots and of the bones and tissue of the skier's shin. These variables have created even more difficulties with prior methods.

BRIEF SUMMARY OF SOME ASPECTS OF THE DISCLOSURE

The applicants believe that they have discovered at least one or more of the problems and issues with prior art systems noted above and advantages variously provided by differing embodiments of a sport-boot pressure monitor, also referred to herein as a sports performance monitoring apparatus, and methods disclosed in this specification.

Briefly and in general terms, a sport-boot pressure monitoring system according to some embodiments includes a left boot sensor having a left flexible fluid-containing bladder shaped to fit between a user's left leg and an interior surface of a left boot worn by the user. The left boot sensor also has a left pressure sense element in pressure-sensing communication with the left flexible fluid-containing bladder. The system includes a right boot sensor having similar components. The system also includes a controller responsive to the pressure sense elements to provide a pressure alert if pressure between one of the user's legs and the interior surface of the boot worn on that leg violates a predetermined pressure threshold and to provide a proximity alert if a distance between the left and right boots violates a predetermined proximity threshold.

The pressure threshold may be a minimum pressure, and a violation of that threshold occurs if the sensed pressure is less than the minimum. Or the pressure threshold may be a maximum pressure in which case a violation occurs if the sensed pressure exceeds that maximum. If the pressure threshold is a range of pressures, a violation occurs if the sensed pressure falls outside that range. In some embodiments there may be different pressure thresholds for left and right legs. Similarly, the proximity threshold may be a minimum desired distance between the boots, a maximum, or a range where the alert is provided if the sensed distance is either less than the low end of the range or more than the high end.

In some embodiments a radio transmitter such as a slave Bluetooth L.E. unit is carried by one of the boot sensors, a radio transceiver such as a master Bluetooth L.E. unit is carried by the other of the boot sensors, the transceiver in signal-receiving communication with the transmitter, and a control unit having a radio receiver such as a another slave Bluetooth L.E. unit in signal-receiving communication with the transceiver. The pressure as sensed in the one boot sensor is transmitted to the transceiver which in turn sends both pressures to the receiver in the control unit.

In some embodiments all functions are carried out within one or both of the boot sensors without a separate control unit, and instead the transceiver communicates with a mobile phone or other device carried by the skier. An app in the mobile phone enables the skier to control the system and receive pressure and proximity alerts through the phone.

In some embodiments, a monitoring system includes pressure sensors respectively adjacent each of a portion of a person's limbs to independently report pressure applied or not applied to the sensor by the associated limb. In some embodiments, the pressure sensors wirelessly report sensed pressure or absence of pressure to one or more remote reporting devices. In some embodiments, sensors can be independently adjusted as desired.

In certain instances, a monitoring system provides a persistent association between a limb and a particular sensor and wirelessly reports information relating to interaction between the sensor and the limb. In some instances, the system provides information allowing the user to learn about that interaction in real time and, if desired, seek to adjust the user's performance in real time as a result.

In certain embodiments, the one or more remote reporting devices can provide an audible sound or other indication in response to information received from one or more sensors. In certain instances, the one or more remote reporting devices provide a left limb audio report to the left ear of the person and a right limb audio monitor report to the right ear of the person.

In some embodiments, at least one sensor includes a bladder, material within the bladder, and a monitor of pressure of the bladder or the material in the bladder. In some embodiments, the material within the bladder may be a fluid that may include a gel, a liquid, a gas, or a mixture of any of these.

In some instances, at least a portion of the sensor extends along substantially all or a portion of a vertical length of a boot. In certain embodiments the sensor includes a transmitter, and in some embodiments the transmitter is mountable external of a boot or other footwear. In certain embodiments the transmitter is mountable to the upper edge of a boot such as a ski boot or other footwear.

In some embodiments, the bladder can extend from a housing containing a transmitter and pressure sensor. In some embodiments, the pressure sensor can monitor pressure in the bladder and the transmitter can transmit signals based upon or related to the level of pressure sensed by the sensor. As noted above, in certain embodiments the transmitter can do so wirelessly.

In some instances, the bladder is mountable adjacent the tongue or other portion of a boot such as a ski boot. Pressure in the bladder can increase or decrease in response to pressure applied by a lower leg in the direction of the boot tongue or other portion of the boot adjacent to which the bladder is mounted.

In some embodiments the bladder has a liner made of a relatively soft, resilient, elastic, and flexible material. In some embodiments the bladder liner can include or be made of rubber or synthetic rubber.

In certain instances, the bladder or other sensor can have a relatively long axially extending section, being (i) relatively wide transverse to the axis of the axially extending section and (ii) relatively thin transverse to the relatively wide dimension. In some embodiments, the pressure of material within the bladder corresponds to changes in pressure against the bladder and tongue of the boot. This pressure can be sensed by a pressure sensor.

In some embodiments, the bladder can be held in place by friction between the bladder and a relatively large surface area that contacts the bladder. Such a fit can be natural and convenient, and a bladder fitted in this way may be imperceptible to the wearer. In some embodiments the bladder can allow for a distribution of pressure against and along the surface of the leg within the boot, thus improving comfort and in some instances facilitating toleration of long-term use. At least certain embodiments of a bladder can be more economical to implement than piezoelectric or other electronic pressure sensing devices.

In some embodiments, the transmitter is relatively small and has one or more of a generally planar lower side, a curved, arcuate mid-section extending upwardly from the lower side, and a bladder extending from the lower side. The curved, arcuate mid-section (or other formation of the transmitter) can include one or more removable battery compartments, batteries, and associated removal structure for gaining access to the one or more battery compartments. At least some of these embodiments can be easily mounted inside a boot, such as a ski boot for example, with the bladder extending within the boot while the transmitter rests on an upper edge of the boot adjacent and somewhat surrounding the user's leg. Some such embodiments can be lightweight as well.

In some embodiments the bladder can include a bleed valve. In certain embodiments the bleed valve can enable the material within the bladder, such as gas in some embodiments, to escape when external pressure decreases past a certain point. In some embodiments, the bleed valve can help prevent damage or undesired change in shape of the bladder as the bladder is transported to differing altitudes.

In certain embodiments, the system can include a controller communicable with the transmitter. In some instances, the controller can include a wireless receiver or transceiver. The receiver or transceiver can be adapted to receive transmissions from the transmitter.

In some embodiments, the controller can be relatively small and lightweight. The controller may have a curved peripheral shape adapted to be easily grasped by a human hand. In some instances the controller can easily be held in one hand or placed in a pocket in the wearer's clothing.

In some embodiments the system can include earphones that can provide an audible indication of pressure sensed by the limb pressure sensors. Such earphones may be small, lightweight, and inexpensive. In other embodiments the system can include one or more loudspeakers.

In some embodiments the user can adjust one or more thresholds (pressure levels) detected by the sensor. In some embodiments a threshold may be set to report pressure going above or below a predetermined level. In a skiing application, for example, pressure going below this threshold in a boot can cause an audible sound to be generated to alert the user. The system can be altered to set thresholds as desired and to emit alerts such as varying sound levels and varying types of sound responsive to pressure events, for example pressure going above or below one or more thresholds.

In various embodiments, a proximity sensor system can detect distance between limbs, portions of limbs, or associated structure. In some embodiments, the system can determine if such a distance is within, or outside of, a preferred range. In some embodiments, a predetermined proximity range can be adjusted by the user to allow for more precise feedback to assisting the user in correcting the distance between the user's limbs or associated structure.

In some embodiments, the sports performance monitoring apparatus may be used for improvements in skiing technique by detecting pressure applied to the front of each respective ski boot. This allows a skier to know which leg has insufficient forward pressure, enabling the skier to correct pressure application for that leg.

In various embodiments, a proximity sensor can generate real time feedback indicating to the skier that the distance between their skis is inside or outside a preferred range. In some embodiments, a defined proximity range can be adjusted by the skier to allow for more precise feedback to assisting the skier in correcting the distance between their skis.

In some embodiments, one or more proximity sensors and pressure sensors are combined in order to improve the quality and quantity of feedback to the user. In some embodiments, providing an indication that the distance separating the skis are outside of a given range can allow the skier to more easily determine if the skier is correcting pressure distribution by improperly positioning the skier's skis rather than properly redistributing pressure. In addition, through simultaneous monitoring of pressure and proximity the skier can instantly determine if a break in form with respect to desired ski separation correlates to concurrent improper pressure distribution.

In some embodiments, the sports performance monitoring apparatus generates distinctive types of notifications that allow a skier to receive simultaneous feedback for proximity of skis and skier weight distribution and lean, enabling the skier to make instantaneous adjustments. In some embodiments, the sports performance monitoring apparatus generates distinct audible tones indicating to the skier whether the tone is associated with ski proximity or with pressure distribution, enabling the skier to make the proper type of correction.

In some embodiments, the sports performance monitoring system is lightweight, economical, and easy to use and maintain. In certain instances, such a system includes two lightweight sensor units. Each sensor unit has a wireless transmitter housing mountable externally from a boot and a pressure sensor with a sensing structure extending downwardly form the housing and mountable within a boot. The system may include a lightweight controller and lightweight earbuds connected to the controller. In some embodiments, the controller includes one or more of the following features:

adjustable volume controls;

independently adjustable left pressure and right pressure threshold ranges;

independent single-button calibration of left pressure and right pressure reference points;

independent LED indicators of active transmission from the left boot sensor unit and the right boot sensor unit;

a control to calibrate and toggle proximity detection activation;

a single button press to change a proximity detection separation point;

a control to reverse the generation of notification tones from too little forward pressure to too much, and from too close foot proximity to too much foot separation; and selection of musical tunes instead of tones.

In some embodiments, the sports performance monitoring system includes two distinct sensor/transmitter components. One of these components, a master boot sensor unit, includes a controller, a proximity sensor, a pressure sensor and a transmitter. The other component, a slave boot sensor unit, includes a controller, a pressure sensor and a transmitter. In some embodiments, proximity detection is accomplished by the proximity sensor detecting and measuring the strength of the pressure signal transmitted by the slave boot sensor unit. This configuration reduces the number of components used to detect and report proximity by relying on the pressure signal rather than using a separate proximity signal.

In some embodiments the sports performance monitoring includes two sensor/transmitter units, one for each boot. Each includes a controller, a pressure sensor and transmitter, and a proximity sensor which may be a receiver. Proximity detection may be accomplished by each proximity sensor measuring the strength of the pressure signal from the other boot to provide a proximity value (for example, distance) and the two values may be averaged to obtain a final proximity value.

In some methods of sports performance monitoring, the pressure measured by a pressure sensor associated with at least one limb is monitored to provide feedback to a user. In some methods, sensors associated with a left boot pressure and a right boot pressure are monitored to provide more precise feedback to a user to improve sport performance. In some embodiments, a left audio signal is provided based on a monitored left leg pressure and a right audio signal is provided based on a monitored right leg pressure. In some embodiments, proximity between two limbs is also monitored to provide very accurate feedback to a user to quickly improve their skiing ability and technique. Many other novel methods are disclosed herein as well.

In some aspects, a sport-boot pressure monitoring system includes a controller comprising a left boot pressure sensor input communicable with a left boot pressure indicator and a right boot pressure sensor input communicable with a right boot pressure indicator. The left boot pressure indicator comprises a left boot pressure audio output and a left earphone, and the right boot pressure indicator comprises a right boot pressure audio output and a right earphone. A left flexible boot pressure sensor is communicable with the left boot pressure sensor input and a right flexible boot pressure sensor is communicable with the right boot pressure sensor input. Each flexible boot pressure sensor comprises a flexible bladder comprising a fluid bladder, with an interior, material-container compartment comprising a fluid-container compartment, and a pressure sensor communicable with the flexible bladder. The system includes a boot proximity sensor and a boot proximity sensor indicator communicable with the boot proximity sensor, the boot proximity sensor indicator comprising a proximity audio output communicable with at least one of the left and right earphones. The controller includes a proximity adjuster communicable with the boot proximity sensor indicator. Some embodiments include a logging function of saving values such as pressure, proximity, and set points, and providing the saved information to a mobile phone or other device.

In some aspects, a sport-boot pressure monitoring system includes a controller having left and right audio outputs. The controller includes a boot pressure sensor input communicable with a master boot sensor unit. The master boot sensor unit in turn is communicable with a slave boot sensor unit. Each boot sensor unit includes a flexible bladder comprising a fluid bladder with an interior, material-container compartment comprising a fluid-container compartment, and a pressure sensor communicable with the flexible bladder. The slave boot sensor unit is responsive to its pressure sensor to transmit a signal indicative of the sensed pressure. The master boot sensor unit is responsive to the signal from the slave boot sensor unit to sense the distance between the master and slave boot sensor units and transmit a signal indicative of that distance and of the sensed pressures from both pressure sensors to the controller. In some embodiments the left and right audio outputs are provided to earphones. In other embodiments the left and right audio outputs may be communicated to a mobile phone, an iPod or MP3 player, or other suitable device for further communication to the user. Either the right or left boot may carry the master boot sensor unit and the other may carry the slave boot sensor unit. In some embodiments the master and slave boot sensor units and the controller comprise Bluetooth L.E. (Low Energy) units, also known as Bluetooth Smart units; in these embodiments the slave boot sensor unit communicates only with the master boot sensor unit, and the controller likewise communicates only with the master boot sensor unit.

Some embodiments include one or more of the following features: each flexible bladder is frictionally engageable with an inner surface of a boot; the left boot pressure indicator comprises a left pressure threshold adjuster and the right boot pressure indicator comprises a right pressure threshold adjuster; and the left flexible pressure boot sensor comprises a left arcuate housing with the left flexible bladder extending from the left arcuate housing, the left arcuate housing comprising a battery compartment and a pressure sensor circuit. In some embodiments the controller includes the proximity sensor indicator and further comprises a proximity adjuster, and the system may include a left pressure threshold adjuster including a left boot pressure audio output and a right pressure threshold adjuster including a right boot pressure audio output.

In some embodiments the controller has a memory in data-receiving communication with the left and right boot pressure sensors and the boot proximity sensor. The controller may have a data output. The memory may retain a series of measurements over time and may communicate them through the data output to a mobile phone or other external device, for example by a suitable transmitter, a Wi-Fi connection, or the like.

In some embodiments the boot proximity sensor comprises a left receiver carried by the left boot, a right receiver carried by the right boot, a left transmitter carried by the left boot and in communication with the right receiver, and a right transmitter carried by the right boot and in communication with the left receiver. The controller may include hard wiring or software (or both) by which first and second values of boot proximity are determined from signals from the left and right receivers, respectively. The two values may be averaged in the controller by instructions such as circuitry or software or both to provide a final value of boot proximity.

In some embodiments each flexible boot pressure sensor comprises a wireless pressure information transmitter and the controller comprises a wireless pressure information receiver. In some embodiments the boot proximity sensor includes a left receiver carried by the left boot and in communication with the right boot pressure sensor, and a right receiver carried by the right boot and in communication with the left boot pressure sensor.

In some embodiments, a sport-boot pressure monitoring system includes a left bladder shaped for insertion between an interior surface of a left boot and a portion of a left leg above a left ankle of a wearer, the left bladder comprising a left flexible fluid container, a right bladder shaped for insertion between an interior surface of a right boot and a portion of a right leg above a right ankle of the wearer, the right bladder comprising a right flexible fluid container, a left pressure sensor in pressure-sensing communication with the left bladder, a right pressure sensor in pressure-sensing communication with the right bladder; and a controller in data-receiving communication with the left and right pressure sensors, the controller including an output.

Some embodiments of a method of monitoring pressure in sport boots include monitoring left-boot pressure between an interior surface of a left boot and a portion of a left leg above a left ankle of a wearer, monitoring right-boot pressure between an interior surface of a right boot and a portion of a right leg above a right ankle of the wearer, providing the wearer with an audible left signal indicative of the left pressure, and providing the wearer with an audible right signal indicative of the right pressure. In some embodiments, monitoring pressure in either or both boots includes inserting a fluid-containing bladder between the interior surface of the boot and the leg of the wearer, and monitoring an output from a pressure sensor in pressure-sensing communication with a fluid in the bladder. The audible signal may be based on the pressure being greater than, or being less than, a predetermined threshold or a threshold set by the wearer. The method may also include monitoring boot proximity and providing an audible proximity signal based on the monitored boot proximity; this may be done by comparing the actual boot proximity with a proximity threshold that may be predetermined or set by the wearer.

There are other novel aspects of the present application. They will become apparent as this specification proceeds. It is therefore to be understood that the scope of the invention is to be determined by the claims as issued and not by whether the claimed subject matter solves any particular problem or all of them, provides any particular features or all of them, or meets any particular objective or group of objectives set forth in the Background or this Summary.

BRIEF DESCRIPTION OF THE DRAWINGS

The preferred and other embodiments are shown in the accompanying drawings in which.

DETAILED DESCRIPTION

The following description provides examples, and is not limiting of the scope, applicability, or configuration set forth in the claims. Changes may be made in the function and arrangement of elements discussed without departing from the spirit and scope of the disclosure. Various embodiments may omit, substitute, or add various procedures or components as appropriate. For instance, the methods described may be performed in an order different from that described, and various steps may be added, omitted, or combined. Also, features described with respect to certain embodiments may be combined in other embodiments.

Figure 1:
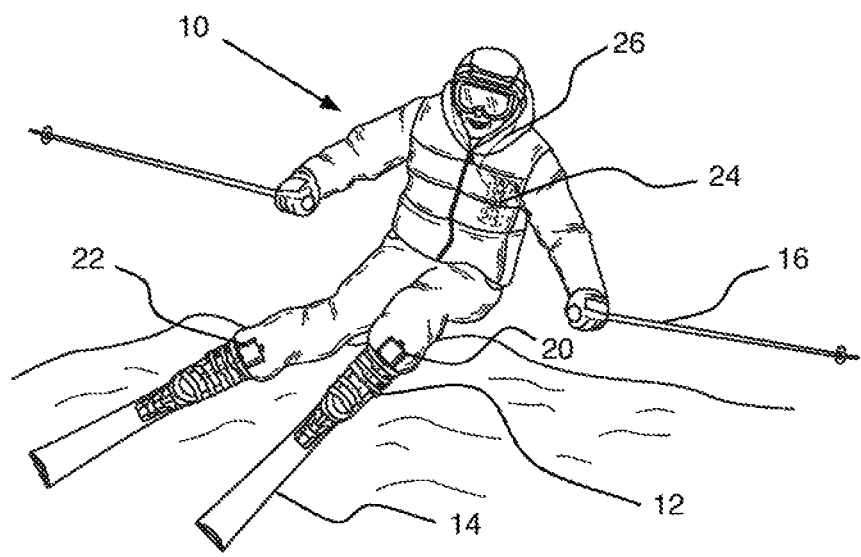
FIG. 1 is a perspective view of a sports monitoring system operated by a skier according to an exemplary embodiment disclosed herein.

FIG. 1 depicts a skier 10 wearing ski boots 12 connected to a pair of skis 14. The skier is holding ski poles 16. The skier 10 is using an exemplary embodiment of a sports monitoring system that includes two boot sensor units 20 and 22 in communication with a controller 24. The boot sensor units 20 and 22 communicate information regarding the performance of the skier's respective limbs, here the skier's legs, to the skier. More particularly, the boot sensor units 20 and 22 detect, by means of pressure sensors to be described presently, when too much or too little pressure is being applied to each respective boot by the skier. This information is fed back to the skier via the controller 24, which may be a wireless controller insertable into a pocket of the skier's clothing. In some embodiments, information from the controller 24 is communicated to the skier through earphones 26. The boot sensor units 20 and 22 may detect proximity of the boots to each other and provide this information simultaneously with pressure information to the skier. Information relating to pressure may be audibly distinct from information relating to proximity.

In alternative embodiments, the controller 24 may communicate with one or both of the boot sensor units 20 and 22 through wire connections. In other embodiments the boot sensor units 20 and 22 may communicate with the controller 24 through tubes capable of containing a gas; in these embodiments the pressure sensors are actually located in the controller 24.

Figure 2:
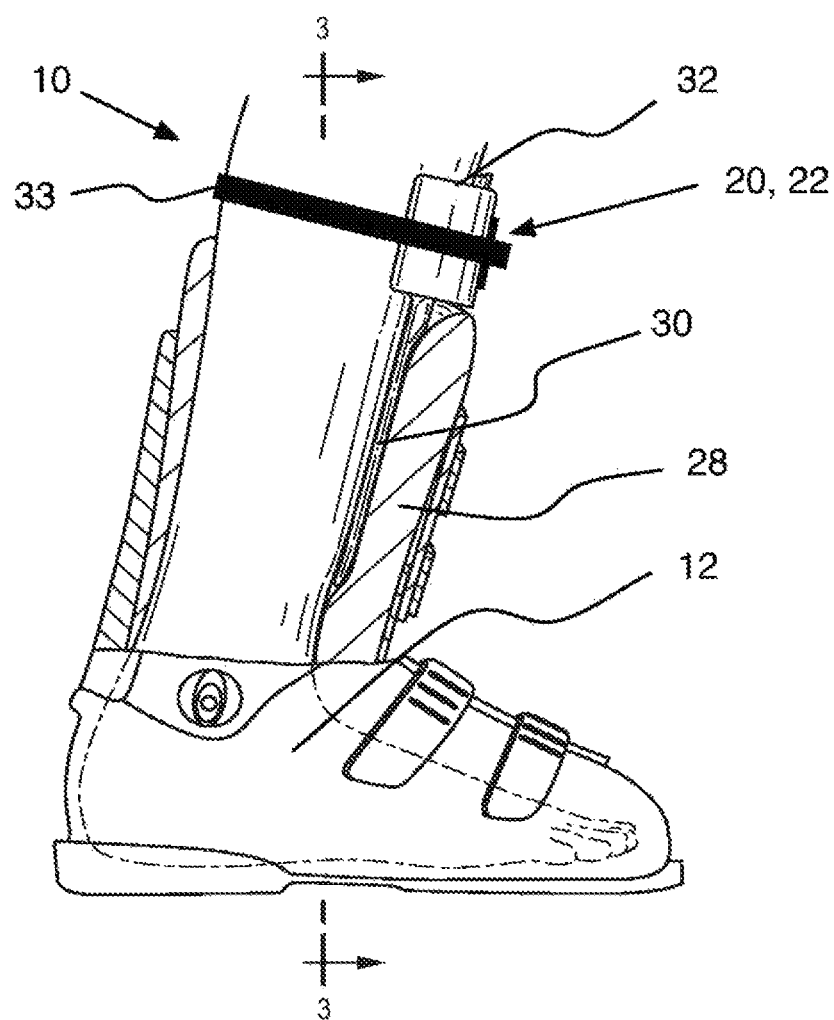
FIG. 2 is a side elevational view of a boot sensor unit of FIG. 1 positioned in a ski boot partially cut out.

With reference to FIG. 2, the boot sensor unit 20 or 22 includes a gas-filled bladder 30 made of thin rubber extending from a housing 32, which includes at least a transmitter and a pressure sensor. Each gas-filled bladder is easily insertable between the ski boot 12 and a leg of the skier 10. In the embodiment of FIG. 2, the gas-filled bladder 30 is inserted between the shin of the skier 10 and a tongue 28 of the ski boot 12. The gas-filled bladder 30 is held in place by friction created between the gas-filled bladder 30 and the shin of the skier 10 and between the gas-filled bladder 30 and an inward face of the tongue 28 of the ski boot 12.

The housing 32 is held in place approximately one inch above the top of the tongue 28 of the ski boot 12 by a strap 33. The strap 33 may be fastened using Velcro or the like. Alternatively, the bottom side of the housing 32 could rest on the top edge of the boot tongue 28 or other upper boot structure.

The gas-filled bladder 30 is communicatively coupled to at least one pressure sensor that senses pressure of a material contained within the gas-filled bladder 30. The material within the gas-filled bladder 30 may be a fluid such as a gel, a liquid, a gas, or a mixture of some or all of these. In the embodiment of FIG. 2, the material contained within the gas-filled bladder 30 is ambient air. The pressure of the material within the gas-filled bladder 30 corresponds to changes in pressure against the gas-filled bladder 30 and the tongue 28 of the ski boot 12.

The gas-filled bladder 30 is made of a relatively soft, resilient, elastic, and flexible material. The gas-filled bladder 30 can include or be made of rubber or synthetic rubber. The gas-filled bladder 30 includes a relatively long axially extending section, being relatively wide transverse to axis of the axially extending section and relatively thin transverse to the relatively wide dimension. In the embodiment of FIG. 2, the gas-filled bladder is approximately 8.5 inches long with 0.5 inches of the gas-filled bladder located within the housing 32 to ensure an air-tight seal between the gas-filled bladder 30 and the housing 32, and the bladder is approximately 1 inch wide and can increase to approximately 0.75 inches in depth given full air pressure in the bladder 30 to provide accurate pressure sensing without causing discomfort to the skier 10. These dimensions can increase or decrease by as much as 50 percent or more to better function in different sized boots or to provide better sensing, reduce power consumption, etc. It should further be appreciated that the shape of the gas-filled bladder 30 can include various other shapes that, for example, can be inserted between the tongue 28 of the ski boot 12 and the leg of the skier.

In alternative embodiments, the boot sensor units 20 and 22 may include any pressure sensor system that senses pressure along a substantial length of the front of the ski boot 12. These alternative embodiments may include, instead of or in combination with the gas-filled bladder 30, any of a number of types of pressure sensors placed along a substantial length of the tongue 28 of the ski boot 12 to accurately detect changes in pressure. Such pressure sensors may include, for example, compressed gas pressure sensors, piezo resistive strain gauge sensors, capacitive pressure sensors, electromagnetic pressure sensors, piezoelectric pressure sensors, and potentiometric sensors. The specific operation of the pressure sensors will be further described in reference to FIG. 8 below. Such alternative pressure sensors can be used to detect backward pressure against the ski boot 12, lack of backward pressure against the ski boot 12, or excess pressure against the front of the ski boot 12.

Figure 3:
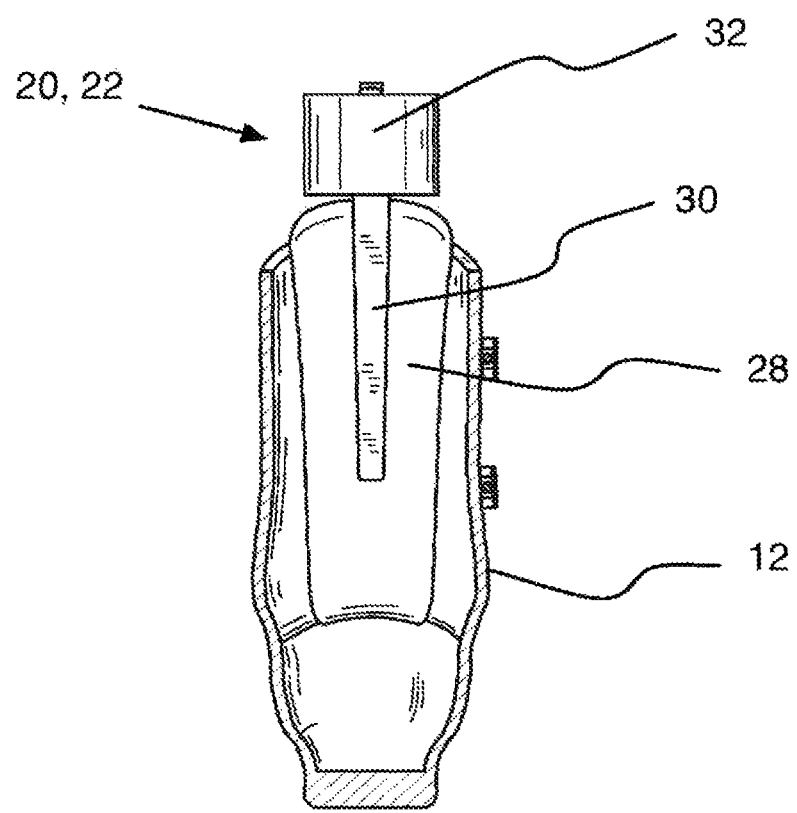
FIG. 3 is a rear cross-sectional view of the boot sensor unit of FIG. 2 mounted adjacent the boot tongue.

FIG. 3 gives a more detailed rear view of an exemplary embodiment of the boot sensor unit 20 or 22 including the gas-filled bladder 30 extending from the housing 32 and in contact with the tongue 28 of the ski boot 12. However, the gas-filled bladder 30 may instead be inserted between the leg of the skier 10 and the back of the ski boot 12, or any other position desirable for the improvement of sport performance. For example, in skiing powder conditions, it may be useful for the skier 10 to be notified when too little or too much backward pressure is exerted against the ski boot 12 to help the skier 10 keep the skis 14 afloat and prevent the front of the skis 14 from diving into the snow. In such circumstances it may be useful to place the boot sensor units 20 and 22 in the backs of the ski boots between the calves of the skier and back portions of the ski boots. Similarly, it may be useful to notify the skier when too little or too much forward pressure is exerted against the tongues 28 of the ski boots. This and other such configurations will be further discussed in reference to FIG. 6 below.

Figure 4:
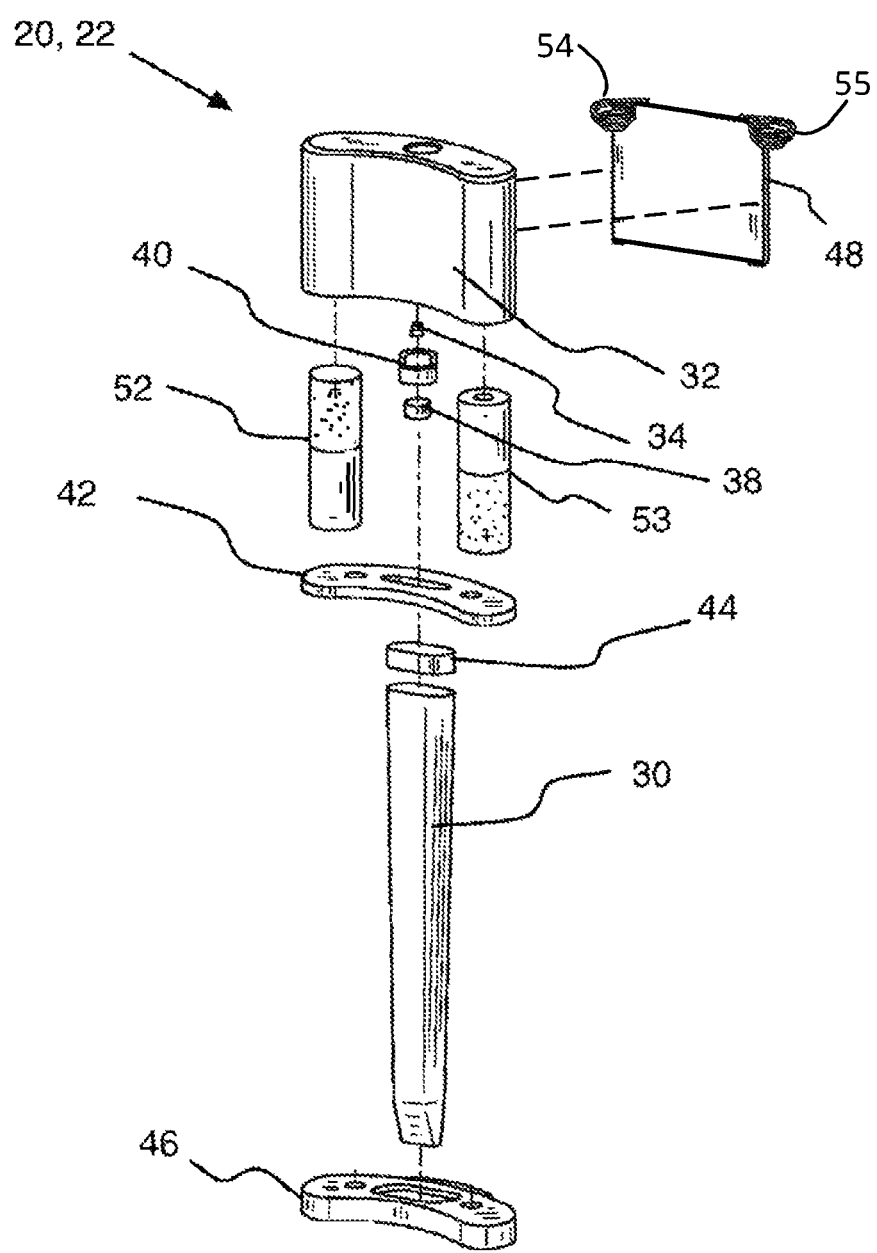
FIG. 4 is an exploded perspective view of the boot sensor unit of FIG. 2.

FIG. 4 provides an exploded side view of an exemplary embodiment of the boot sensor unit 20 or 22 including the gas-filled bladder 30 extending from the housing 32. The housing 32 may be a molded plastic housing. In some embodiments, a button 34 activates a tact power/reset switch 38 and also serves as a bleed valve when located on an upper portion of the housing 32. The reason for having a bleed valve is to allow for pressure normalization at altitude, thus allowing the gas-filled bladder 30 to maintain a normal shape. The tact power/reset switch 38 is protected from unintentional operation by a protective barrier 40 which may be made of plastic or other suitable material. In certain embodiments, the protective barrier 40 is integral to the plastic housing 32. A mounting plate 42, made of metal or other material, connects the housing 32 to a gas-filled bladder plug 44. A cover plate 46, formed of bonder rubber or other material, slips over the gas-filled bladder 30 to seal the housing 32 and create an air-tight compartment including a combination of the gas-filled bladder 30 and the housing 32. Fasteners (not shown) such as screws may be used to connect the cover plate 46 and the mounting plate 42 to the housing 32 to create an air-tight compartment.

In the embodiment shown, the housing 32 has an arcuate shape in the horizontal plane to be placed in contact with the leg of the skier. This housing has an interior radius of approximately 1.585 inches and an exterior radius of approximately 0.44 inches. The housing 32 is approximately 2.275 inches tall and approximately 2.879 inches wide and has a depth of approximately 0.726 inches from the interior radius to the exterior radius. Some or all of these dimensions may be increased or decreased up to 50 percent or even more to reduce weight, to improve sensing, etc. In alternative embodiments, the shape of the housing 32 may also be configured to rest above the back of the ski boot 12 and against the calf of the skier.

Also with reference to FIG. 4, a circuit board 48 is included in the housing 32. A power supply, for example two "AA" or "AAA" batteries 52 and 53, for example alkaline batteries, may be provided. In this embodiment, the two batteries are connected in series through the mounting plate 42, with a positive terminal of the battery 52 contacting a spring contact 54 and a negative terminal of the battery 53 contacting a spring contact 55. Other power sources may be used and may be located apart from the boot sensor unit 20 or 22; for example, a battery pack may be wired to the boot sensor unit 20 or 22 and carried in the skier's pocket or attached to any convenient place such as a rear of the ski boot 12, 10. A rechargeable power source may be provided and may be charged by a USB connection, a wireless charging platform, or the like. Or the various components of the boot sensor unit 20 or 22 may be consolidated to reduce size and power consumption.

In some embodiments, each boot sensor unit 20 or 22 weighs approximately 5.7 ounces with two "AA" alkaline batteries 52 and 53 inserted into the housing 32. In some embodiments, the weight of the two boot sensor units 20 and 22 differs based on added functionally included in one or more boot sensor units 20 and 22. These weights are merely exemplary and may increase or decrease depending on design, type of battery, features provided, etc. Substantial weight reduction may be possible with miniaturization of the circuit board 48 and its components.

Figure 5:
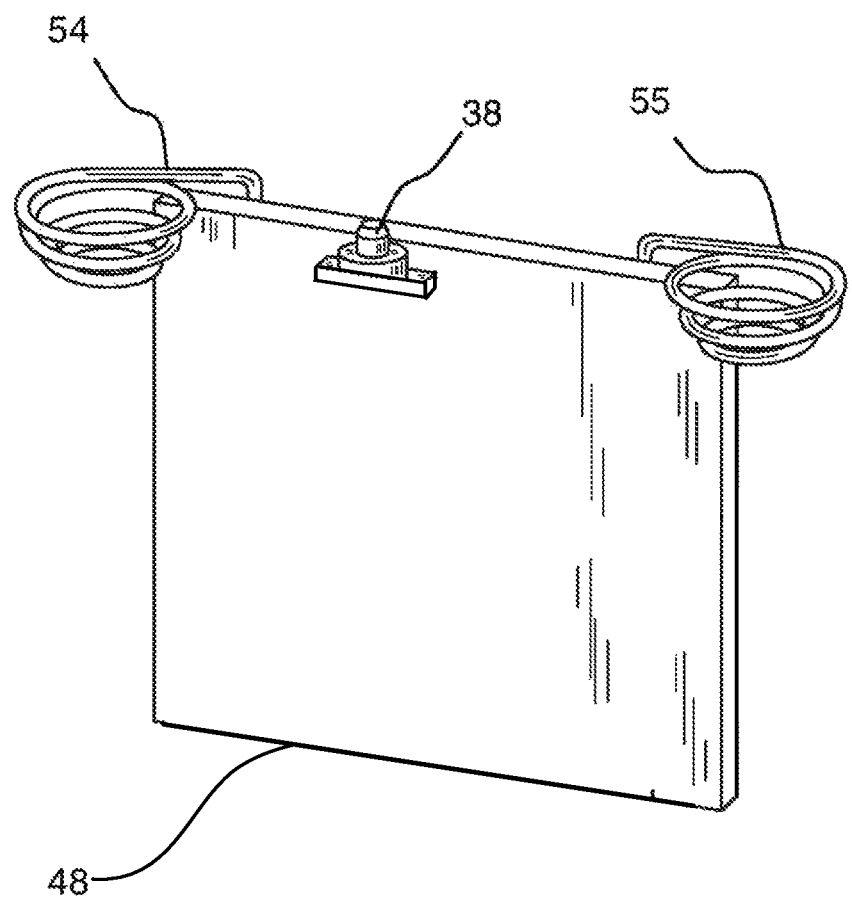
FIG. 5 is a side perspective view showing various components including the circuit board of the boot sensor unit of FIG. 2.

FIG. 5 shows an exemplary embodiment of battery spring terminals 54 and 55, tact power/reset switch 38, and the circuit board 48. The circuit board 48 may carry a Bluetooth L.E. (Low Energy) transceiver (not shown) for communication between one boot sensor unit and the other or between a boot sensor unit and the controller.

The circuit board 48 may also carry various types of intelligent hardware devices, such as a central processing unit (CPU), a general-purpose processor, or a digital signal processor (DSP). It may have electronic circuitry embedded in an application specific integrated circuit (ASIC), a field programmable gate array (FPGA) or other programmable logic device. It may have discrete gate or transistor logic, discrete hardware components, or any combination thereof to enable the boot sensor units 20 and 22 to communicate with each other and with the controller 24. A general-purpose processor may be a microprocessor, but may also be any conventional processor, controller, microcontroller, or state machine or may be implemented as a combination of computing devices such as a microprocessor and a DSP, a microprocessor and a DSP core, multiple microprocessors, or the like.

Figure 6:
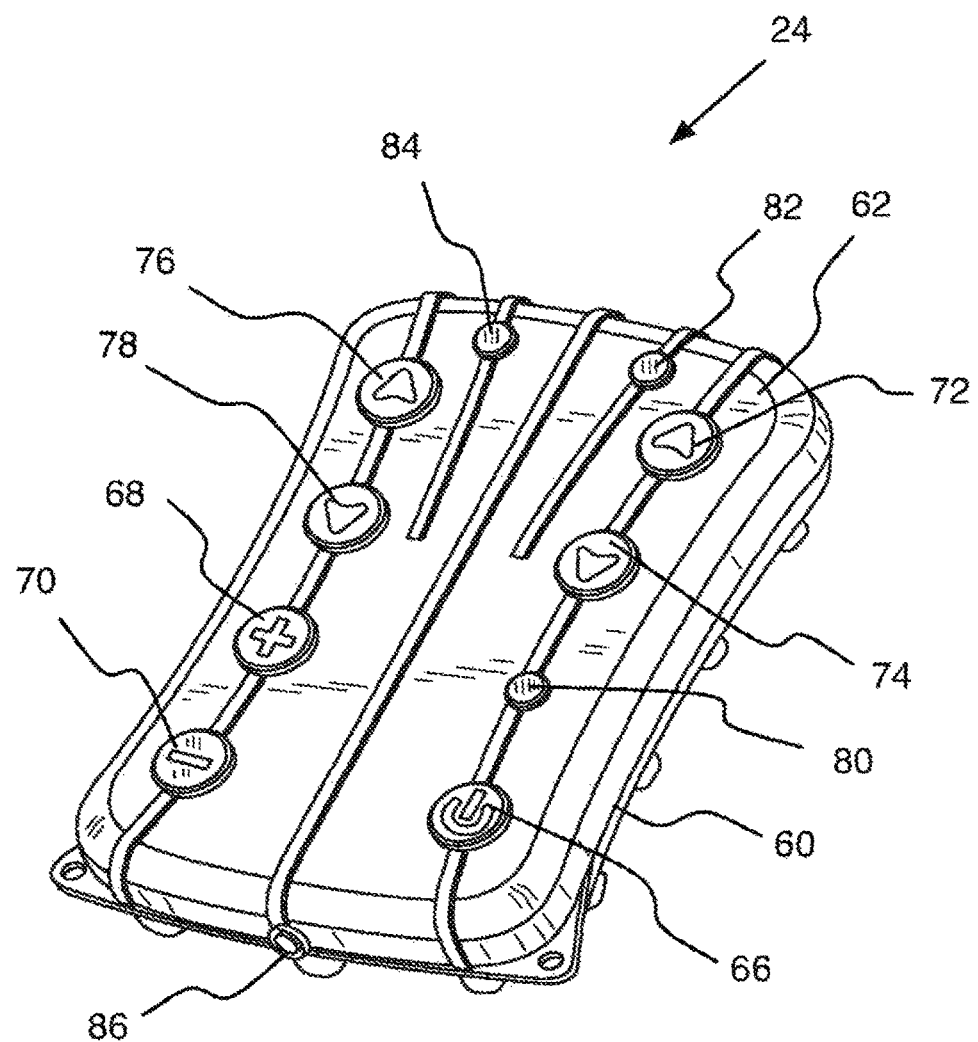
FIG. 6 is a front perspective view of a controller of the system of FIG. 1.

FIG. 6 illustrates an exemplary embodiment of a controller 24. In some embodiments the controller includes a transmitter, receiver, or transceiver, for example a Bluetooth L.E. unit, for wireless communication with the boot sensor units 20 and 22. In some embodiments one boot sensor unit is a master unit and the other is a slave, and in these embodiments the controller 24 may also comprise a slave that communicates only with the master boot sensor unit. The controller 24 is enclosed in a water-resistant or waterproof housing 60 which may be made of hard plastic, soft plastic, or other suitable material. The controller 24 includes a power source, for example, two "AA" or "AAA" alkaline batteries. As described above, other power sources enclosed in, or separate from, the controller 24 may be used instead.

Various controls are provided. In some embodiments, buttons protrude through holes in a front cover 62 of the controller 24. These may include one or more of a power button 66; volume increase and decrease buttons 68 and 70, respectively; right pressure sensitivity adjustment buttons 72 and 74; and left pressure sensitivity adjustment buttons 76 and 78. In the embodiment shown, indicia carried by the right pressure sensitivity adjustment buttons include an "up" arrow on the button 72 to indicate that it increases the sensitivity and a "down" arrow on the button 74 to indicate that it reduces the sensitivity. Depending on how the controls are configured and whether a proximity sensitivity control is included, the indicia may be arranged differently as desired; for example, some buttons may carry "left" or "right" arrows to indicate the left and right sensors, respectively, as will be described in more detail presently.

In some embodiments the controller 24 also includes one or more visual indicators such as LEDs. These may include a power indicator 80, a right pressure indicator 82, and a left pressure indicator 84. When the controller 24 is powered up by depressing the power button 66, the power indicator 80 may blink at one rate to indicate satisfactory power is being supplied and at a second rate to indicate that insufficient power is being supplied, for example because the batteries need to be replaced or recharged. In alternative embodiments, the skier may be notified of insufficient power by audio signals.

In the embodiment of FIG. 6, the controller 24 has a rectangular shape with shorter sides of a convex shape having a radius of approximately 5.816 inches and longer sides of a concave shape having a radius of approximately 9.894 inches. The controller 24 is approximately 4.952 inches in length, approximately 3.052 inches in width, and approximately 0.695 inches in depth. These dimensions are not critical and may be varied as desired. In alternative embodiments the controller 24 may be contained in an enclosure attachable to a wrist or an ear of the skier or may communicate through a mobile phone, an iPod or MP3 player, or other wireless or wired communication device.

In the embodiment shown, the controller 24 weighs approximately 7.2 ounces with two "AA" alkaline batteries. This weight may increase or decrease depending on design, type of power supply, etc.

When the controller 24 receives a signal from one of the boot sensor units 20 or 22, a corresponding right or left pressure indicator 82 or 84 will blink continually to inform the skier that the system is sending and receiving signals. In alternative embodiments, in response to receiving a signal from at least one boot sensor unit 20 or 22, the controller 24 generates an audio output signal.

The indicators 82 and 84 may blink at one rate to indicate satisfactory power is being supplied to each of the boot sensor units 20 and 22 and at a second rate to indicate the contrary.

The power button 66 may have various effects depending on how long it is held down. For example, it may power up the system if depressed for one interval of time, silence tone generation if depressed for another interval, reactivate an inactive boot sensor unit 20 or 22 if depressed for a third interval, and so one.

An audio output signal may be provided through a stereo audio output jack 86, or through some other connector, through earphones hardwired to the controller 24, or wirelessly. The volume adjustment buttons 68 and 70 increase or decrease the volume of a tone output, for example by one small step each time the button is depressed. When a button is depressed, a tone may be generated so the skier can select a desired volume. Right and left sensitivities are set with the right pressure sensitivity adjustment buttons 72 and 74 and the left pressure sensitivity adjustment buttons 76 and 78, for example by pressing and holding the right sensitivity button 74 or the left sensitivity button 76 for a set period of time. In some embodiments, both are pressed simultaneously to set sensitivity and then right and left forward pressure points are set by using the right and left pressure sensitivity buttons 72 and 78. A tone may be generated to indicate to the skier that the pressure thresholds have been set. The right sensitivity adjustment buttons 72, 74 and the left sensitivity adjustment buttons 76, 78 control the sensitivity of the pressure sensor by adjusting a threshold value that is compared to the pressure data received from the boot sensor units 20 and 22. The signal from each of the boot sensor units 20 and 22 is converted to a value that may then be compared to the corresponding right or left threshold setting. If the value is too low or too high, a tone is generated on the corresponding left or right audio channel. The controls may be operated to select an indicator only if the pressure is too low, only if it is too high, or both, as the skier may desire.

In alternative embodiments, the controller 24 may further include a tone inversion switch that toggles the audio output between two states. The default setting generates a tone when there is a state of no forward pressure as compared to the threshold pressure value. The reverse setting may generate a tone when there is sufficient forward pressure as compared to the threshold pressure value. This reverse setting may be useful, for example, when the skier is skiing in powder conditions and too much forward pressure against the boots 12 may cause the skis 14 to dive into the snow and inhibit performance. Further, this reverse setting may also be useful, for example, for bump skiing where too much forward pressure may result in less than optimal performance. This reverse setting may be useful in other ski conditions and circumstances, and it may be used in combination with a placement of the boot sensor units 20 and 22 in the back of the ski boots to indicate inadequate forward pressure, similar to the default setting when the boot sensor units 20 and 22 are placed in the front of the ski boots.

The left and right pressure sensitivity buttons 78 and 74 may toggle activation of proximity monitoring if depressed simultaneously for a set period of time, for example two seconds.

In alternative embodiments, different combinations of buttons held for various time periods may be used for the various functionalities described above.

Figure 7:
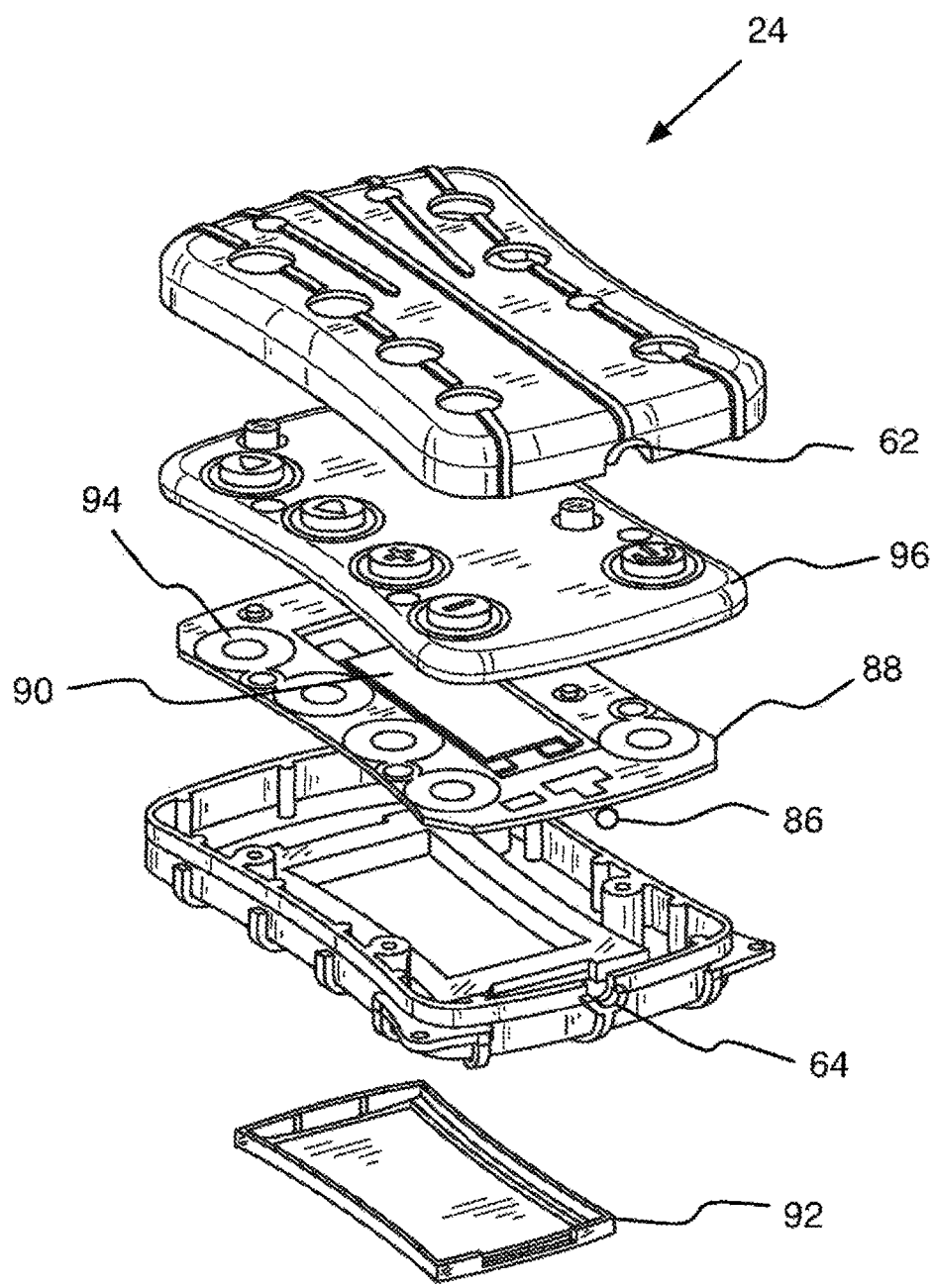
FIG. 7 is an exploded perspective view of the controller of FIG. 6.

FIG. 7 gives an exploded front angle view of an exemplary embodiment of the controller 24. The stereo audio jack 86 is attached to the back of a printed circuit board 88 flush with the lower edge. A microcontroller 90 is located on the printed circuit board 88. The housing 60 further includes the front cover 62 and a back cover 64. Cutouts in the front cover 62 and the back cover 64 allow for access to the stereo audio jack 86 for the earphones 26. A removable battery cover 92 that snaps into a locking position to cover a cutout in the back cover 64 allows for access to a power source, which in this embodiment includes two "AA" batteries positioned on a surface of the printed circuit board 88. As discussed above, other power sources may be used. Switch pads 94 are located on the printed circuit board 88 that correspond to the buttons on a contact-sensitive silicone rubber keypad 96. In alternate embodiments a separate audio controller may be included on the circuit board 88.

Figure 8:
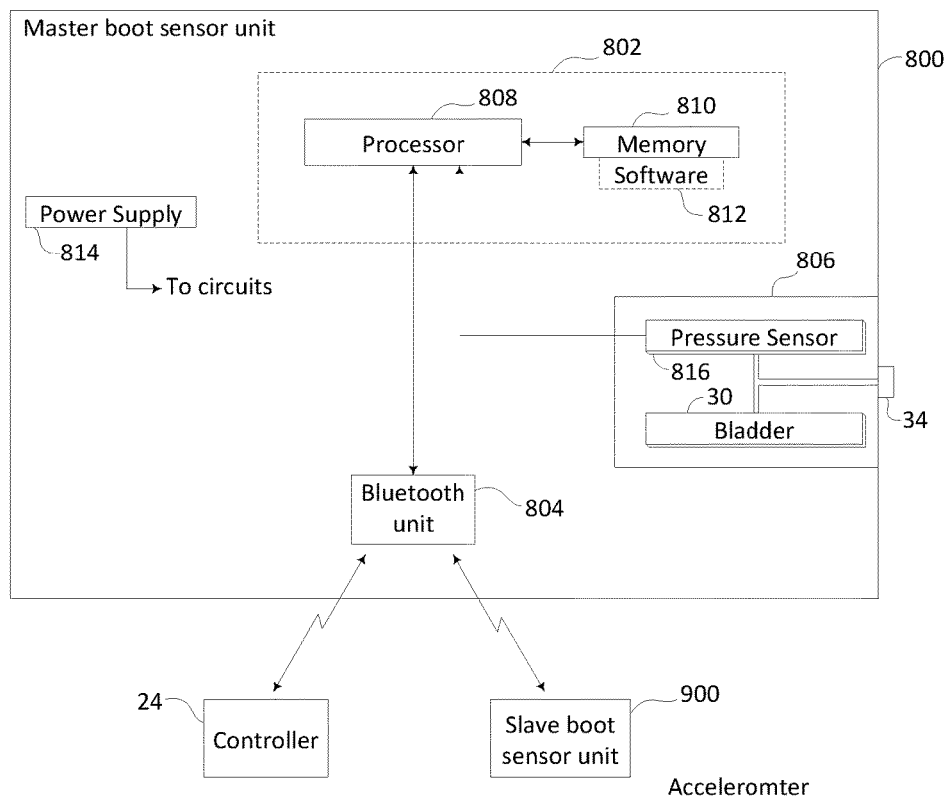
FIG. 8 is a block diagram of components of a master boot sensor unit of the sports monitoring system of FIG. 1.

FIG. 8 gives an example of a master boot sensor unit 800, which can be one of the boot sensor units 20 or 22. In other embodiments, other boot sensor units may include similar components and functionality. The master boot sensor unit 800 includes a control module 802, a master Bluetooth unit 804 communicatively coupled to the control module 802 for communicating with the controller 24 and with a slave boot sensor unit 900, and a pressure sensor unit 806 communicatively coupled to the control module 802. These components may be implemented on a circuit board such as the circuit board 48 of FIG. 5. The master Bluetooth unit 804 may be a Bluetooth L.E. (Low Energy) unit.

The control module 802 includes a processor 808 and a memory 810 that contains software 812 for execution by the processor 808. The processor 808 may comprise a single integrated circuit chip or several chips including logic elements and other circuits. A power supply 814 provides operating power for the circuit components; as shown in FIGS. 4 and 5, in some embodiments two "AA" batteries in series may serve as the power supply.

The processor 808 and the memory 810 may be implemented using one or more intelligent hardware devices, as referenced above, such as a central processing unit (CPU) such as those made by Intel® Corporation or AMD®, a general-purpose processor, a digital signal processor (DSP), an application specific integrated circuit (ASIC), a field programmable gate array (FPGA) or other programmable logic device, discrete gate or transistor logic, discrete hardware components, or any combination thereof. A general-purpose processor may be a microprocessor, but may also be any conventional processor, controller, microcontroller, or state machine. A processor may also be implemented as a combination of computing devices, for example, a combination of a DSP and a microprocessor, multiple microprocessors, one or more microprocessors in conjunction with a DSP core, or any other such configuration.

In some embodiments the memory 810 comprises flash memory. The memory 810 may include random access memory (RAM), read-only memory (ROM), EEPROM, or any other medium that can be used to carry or store desired program code. The memory 810 may store computer-readable, computer-executable software code 812 containing instructions that are configured to, when executed (or when compiled and executed), cause the processor 808 to perform various functions such as pressure detection, proximity detection, transmission and reception of one or more signals using a one or more communication channels, etc.

The pressure sensor unit 806 includes a pressure sensor 816, the bladder 30, and the bleed valve 34. In the drawing these components are shown as interconnected with gas-carrying tubing, although they may be directly mounted to each other with no intervening tubing. The pressure sensor 816 may comprise any type of pressure sensor, for example compressed gas pressure sensors, piezo resistive strain gauge sensors, capacitive pressure sensors, electromagnetic pressure sensors, piezoelectric pressure sensors, and potentiometric sensors. The pressure sensor 816 may comprise a miniaturized Manifold Absolute Air Pressure sensor, such as an Infineon® TurboMap® or Infineon® KP229E3518. The pressure sensor 816 continuously provides a pressure signal indicative of the pressure value to the control module 802. In alternative embodiments, the pressure sensor 816 may periodically communicate the pressure signal to the control module 802. The processor 808 may perform any needed filtering and analog-to-digital conversion of the pressure signal, or such filtering and conversion may be performed in a separate signal conditioner (not shown).

The master Bluetooth unit 804 communicates wirelessly with a slave Bluetooth unit 902 in the slave boot sensor unit 900. Through communication directly between the master and slave Bluetooth units, the master Bluetooth unit 804 can determine proximity of one boot to the other by signal strength measurement. Either the left boot or the right may carry the master boot sensor unit 800 and the other may carry the slave boot sensor unit 900. The master Bluetooth unit 804 also communicates with a slave Bluetooth unit in the controller 24. In other embodiments, separate transceivers may be used for communication between the master and slave boot sensor units and between the master boot sensor unit and the controller. In some embodiments, some or all of the functions of the processor 808 and the memory 810 may be physically embodied in the Bluetooth unit 804.

If pressure as sensed by the pressure sensor 816 and communicated to the controller 24 is too high or too low, a tone is provided to the skier. For example, if the master boot sensor unit 800 is attached to the left boot, the tone will be heard in a left earphone. When the skier hears the tone in the left ear, the skier knows that an incorrect amount of pressure is being applied by the left leg. Similarly, the master boot sensor unit provides a signal to the controller 24 indicative of the proximity of the boots to each other. If the proximity is not within a predetermined proximity range, the skier hears a tone in one or both earphones.

The pressure sensor 816, the bladder 30, and the bleed valve 34 make up a sealed air-tight system. The bleed valve 34 may be combined with the tact power/reset switch 38 to form a single switch as previously described, or the bleed valve 34 may be independent of tact power/reset switch 38.

In the embodiment shown, proximity is detected by measuring signal strength from one boot transmitter to the other. In other embodiments, signal strength both ways is measured; that is, a first signal originating at the left boot is detected at the right boot, and a second signal originating at the right boot is detected at the left boot. The strengths of these two detected signals are averaged to obtain the separation between the boots.

Figure 9:
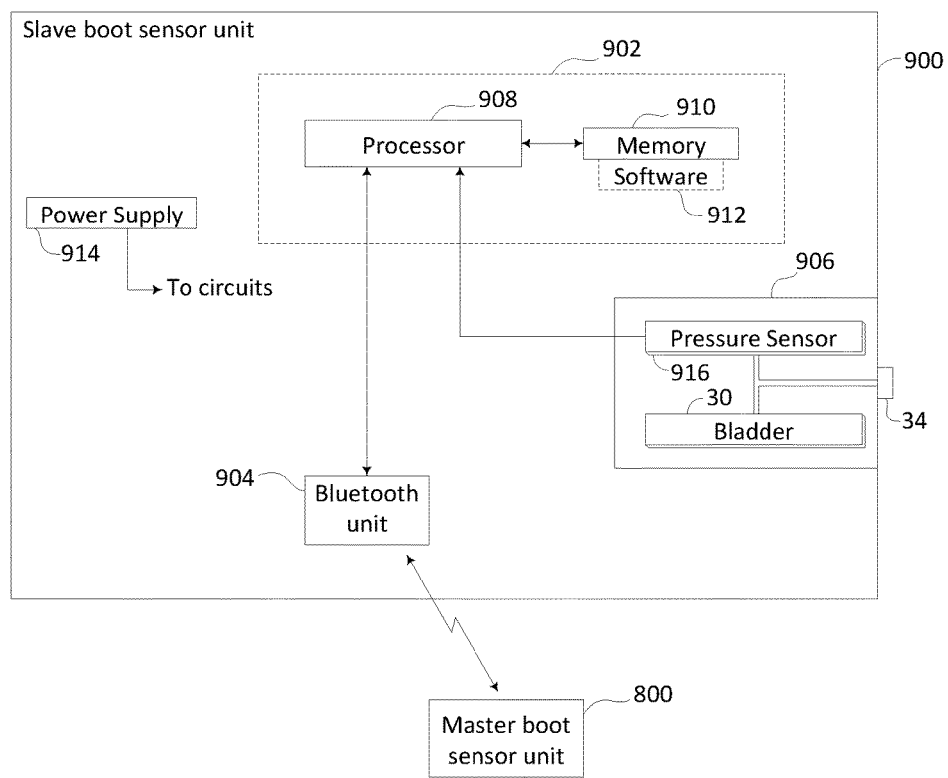
FIG. 9 is a block diagram of components of a slave boot sensor unit of the sports monitoring system of FIG. 1.

FIG. 9 gives an example of a slave boot sensor unit 900, which can be one of the boot sensor units 20 or 22. The slave boot sensor unit 900 includes a control module 902, a master Bluetooth unit 904 communicatively coupled to the control module 902 for communicating with the controller 24 and with the master boot sensor unit 800, and a pressure sensor unit 906 communicatively coupled to the control module 902. These components may be implemented on a circuit board such as the circuit board 48 of FIG. 5. The slave Bluetooth unit 904 may be a Bluetooth L.E. (Low Energy) unit.

The control module 902 includes a processor 908 and a memory 910 that contains software 912 for execution by the processor 908. The processor 908 may comprise a single integrated circuit chip or several chips including logic elements and other circuits. A power supply 914 provides operating power for the circuit components; as shown in FIGS. 4 and 5, in some embodiments two "AA" batteries in series may serve as the power supply.

The components of the slave boot sensor unit 900 are generally similar to those of the master boot sensor unit 800, except that the Bluetooth unit 904 is a slave unit whereas the Bluetooth unit 804 is a master unit.

Figure 10:
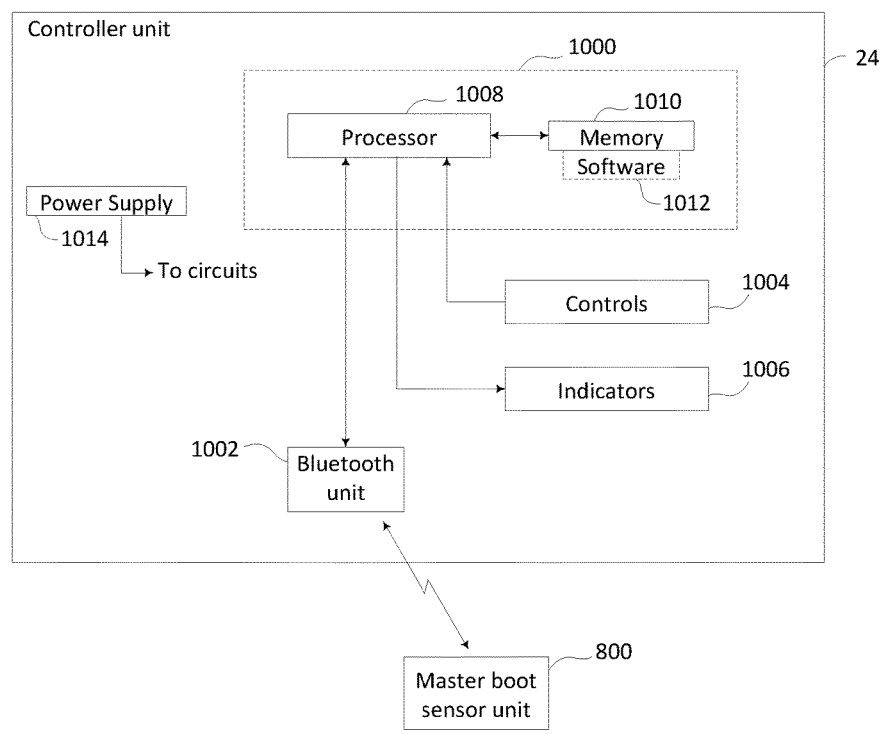
FIG. 10 is a block diagram of components of a controller of the sports monitoring system of FIG. 1.

A block diagram of the controller 24 according to an exemplary embodiment is shown in FIG. 10. The controller 24 includes a control module 1000, a Bluetooth unit 1002, one or more controls 1004 such as pushbuttons, and one or more indicators 1008 which may be LEDs. The control module 1000 includes a processor 1008 and a memory 1010 that contains software 1012 for execution by the processor 1008. The processor 1008 may comprise a single integrated circuit chip or several chips including logic elements and other circuits. A power supply 1014 provides operating power for the circuit components; as shown in FIG. 7, two "AA" batteries may serve as the power supply.

These components of the controller 24 are generally similar to the components of the boot sensor units 800 and 900 and will not be further discussed. The controls 1004 may comprise push buttons as discussed above with reference to FIGS. 6 and 7, or some other means by which the skier can give instructions to the processor. The indicators 1006 may be visual indicators such as LEDs, as discussed with reference to FIG. 7, or some other visual, audible, or tactile indicators through which the processor can communicate information to the skier. In some embodiments the skier may communicate with the controller 24 through a cellphone or other similar device.

Figure 11:
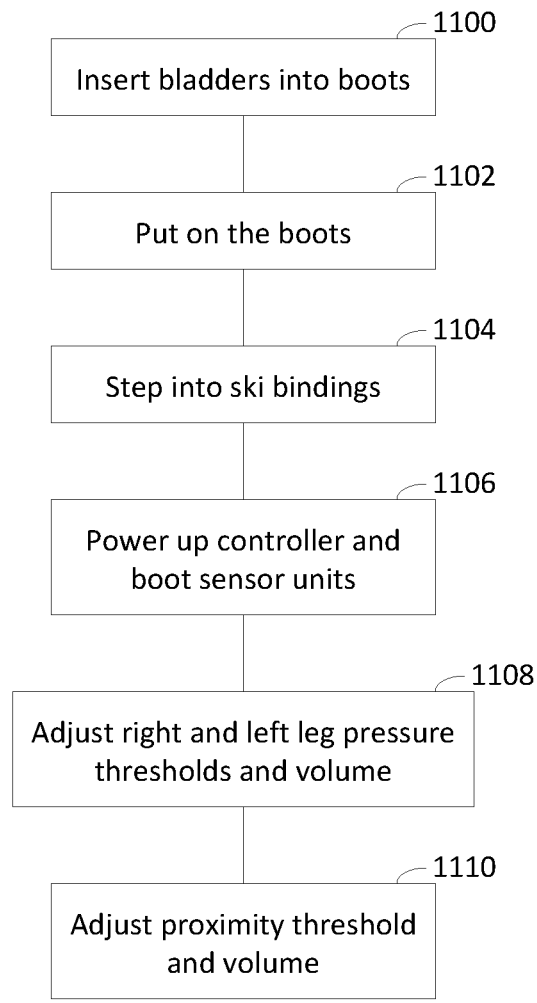
FIG. 11 is a block diagram of the sports monitoring system of FIG. 1.
Figure 12:
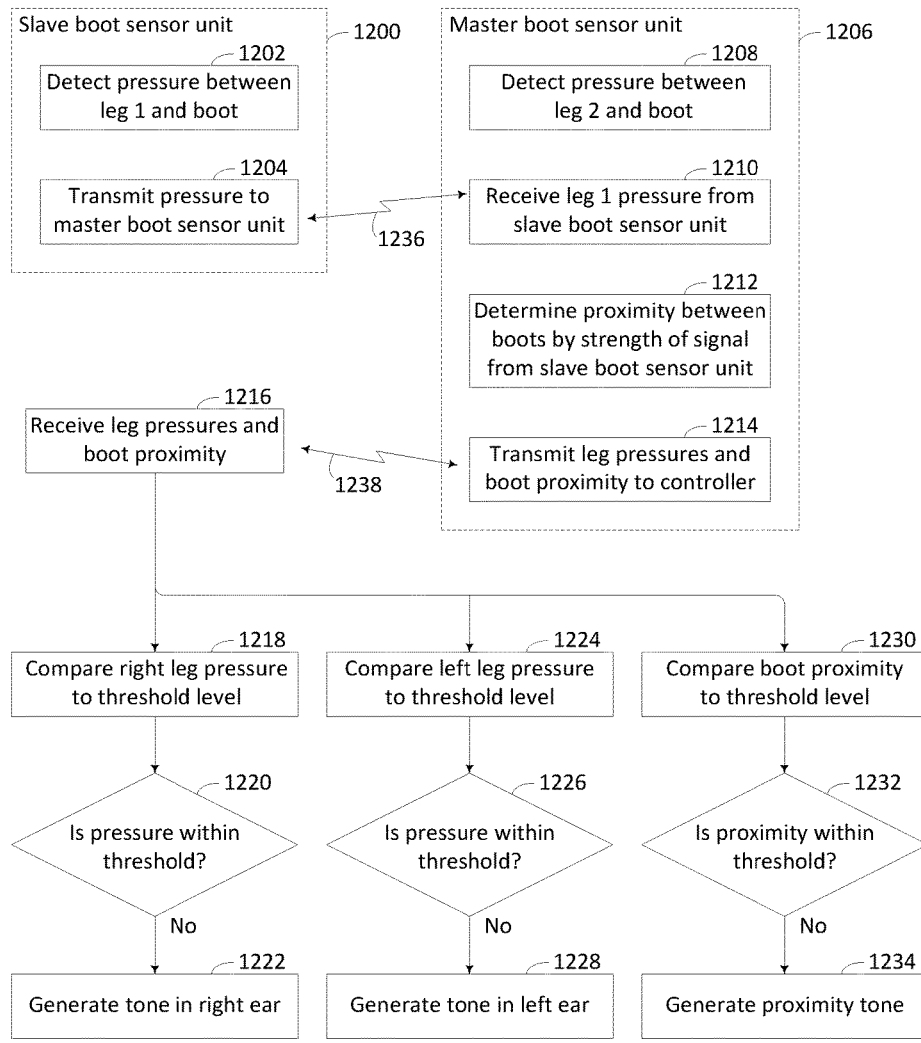
FIG. 12 is a flow chart of functions performed by the components of the sports monitoring system of FIG. 1.

FIGS. 11 and 12 illustrate functions of a sports monitoring apparatus. As shown in FIG. 11, a skier inserts the gas-filled bladders into the ski boots between the boot tongues and the skier's shins (1100). Then the skier secures the ski boots on the legs in conventional manner (1102) and attaches the boots to the skis (1104). The skier powers on the controller and the boot sensor units (1106). The skier takes a standing position with light forward pressure and adjusts the volume to a desired level using the volume adjustment buttons and the right and left pressure threshold controls as desired (1108). The skier can adjust sensitivity of pressure feedback by applying different levels of pressure to the front of the ski boot when adjusting the right and left controls. In a similar manner, the proximity threshold may be set (1110).

Referring to FIG. 12, pressure in the right and left gas-filled bladders 30 increases and decreases based upon the pressure of the skier's shins compressing the bladders. The slave boot sensor unit 1200 detects pressure changes (1202) for leg 1 (for example, the right leg) and transmits them (1204) to the master boot sensor unit 1206. Meanwhile the master boot sensor unit 1206 detects pressure changes (1208) for leg 2 (in this example, the left leg). The master boot sensor unit 1206 receives (1210) the boot pressure signal for leg 1 from the slave boot sensor unit 1200. The master boot sensor unit 1206 determines the proximity (distance) between the boots (1212). The pressure values and proximity value are transmitted (1214) to the controller unit 24 and received (1216) by the controller unit. The right leg pressure is compared (1218) with the threshold value previously set (1108) by the skier, and if the pressure is not within the threshold (1220) a tone is generated in the skier's right ear (1222). Similarly, the left leg pressure is compared (1224) with the threshold value previously set, and if the pressure is not within the threshold (1226) a tone is generated in the skier's left ear (1228). The proximity of the boots is compared (1230) with the value previously set by the skier (1110) and if the proximity is not within the threshold (1232) a proximity tone is generated in one or both ears (1234).

In some embodiments the pressure and proximity signals may be sent to a coach to facilitate coaching of the skier. In some embodiments, as discussed previously, the signals indicating pressure or proximity not within threshold may be sent to a cellphone or other device in addition to or instead of being sent to earphones, or may be stored in a database for later analysis.

Returning to the initial calibration illustrated in FIG. 11, a skier may activate a proximity detection function and set a proximity reference point and associated threshold range by placing the skis a desired distance apart from one another and selecting a proximity set function on the controller 24. The signal indicating proximity out of threshold typically differs in some way from the pressure signal and may be sent to one or both ears as desired.

Figure 13:
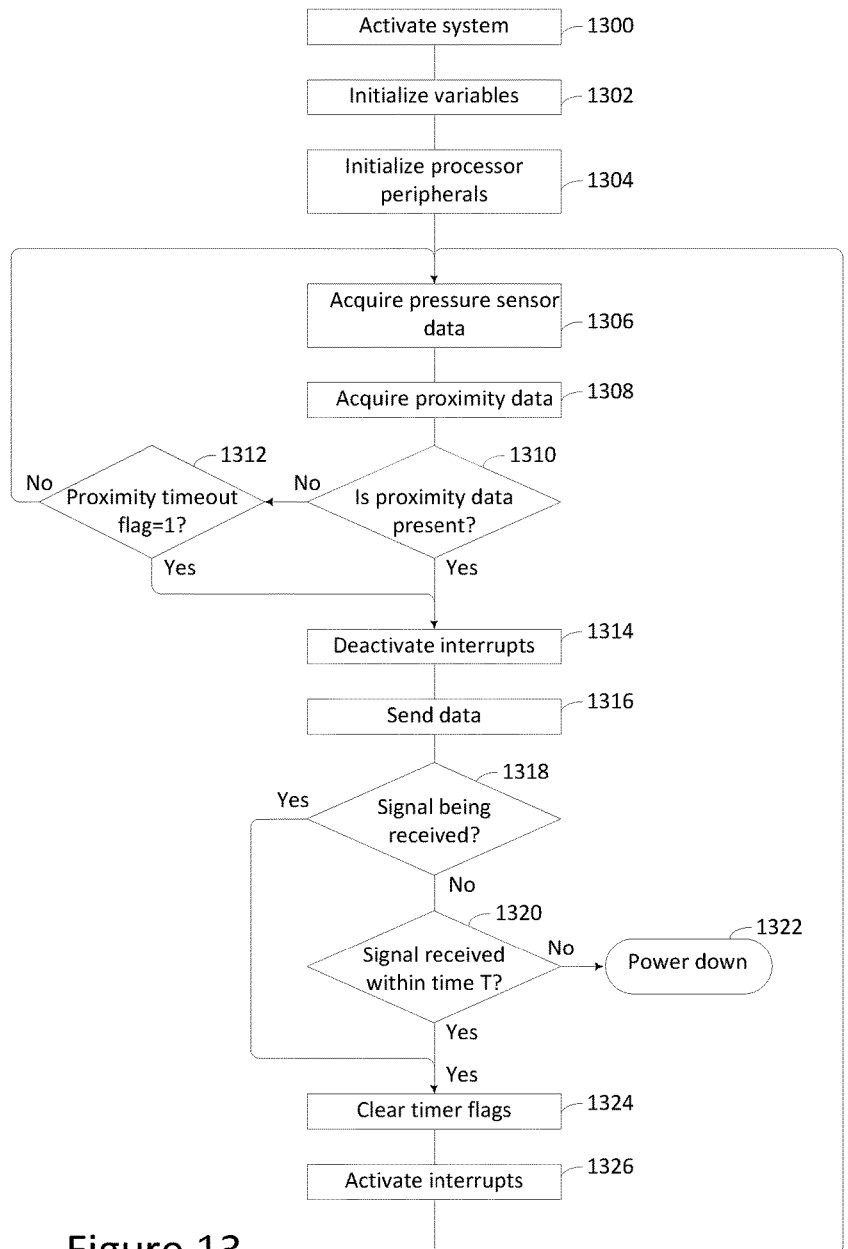
FIG. 13 is a flow chart of functions of the master boot sensor unit of the sports monitoring system of FIG. 1.

FIG. 13 illustrates a master boot sensor unit software process according to some embodiments. When the system is activated (1300), firmware variables are initialized (1302) and processor peripherals are initialized (1304).

Once initialization is complete, acquisition of pressure sensor data is initiated (1306). Typically, the boot sensor units require about 20 mS to execute all the scheduled tasks assigned. In certain embodiments, during the period that the boot sensor units are performing their tasks, and specifically with regard to the pressure sensors, the control modules command the pressure sensors to activate and subsequently provide a delay enabling the pressure sensors to stabilize. After this delay, in some embodiments the control modules execute several, for example sixteen, samplings of the pressure sensor output voltages and average these readings; averaging serves as a minor recursive filter.

Proximity data, determined in some embodiments by the Bluetooth master unit 804 according to the strength of the signal received from the Bluetooth slave unit 904, are also acquired (1308).

If the master boot sensor unit control module determines that there is no valid proximity data (1308), it continues to loop through the data acquisition cycle for a defined period of time. If that period of time is exhausted, a timeout flag is set to 1 (1312) and the process will continue without proximity data. If at any time valid proximity data are acquired, the process proceeds without additional looping through the data acquisition cycle.

Interrupts are deactivated (1314) and data are sent (1316) to the controller 24 for processing and event execution. The controller 24 monitors and determines (1318) if at least one boot sensor unit is sending a sensor signal. If yes, or if the sensor signal has been received within a predetermined time T (1320), the controller 24 remains powered on. If the controller 24 has not received any sensor signals in a predetermined time T, the controller 24 may power down 1322. In some embodiments T may be 10 minutes.

A similar operation can be used for each boot sensor unit once powered on. If a signal is being received from at least one boot sensor unit, or has been received within time T, the boot sensor unit completes its cycle by clearing one or more timer flags (1324) and reactivating interrupts (1326). If no signal has been received within time T, the system powers down (1322). Other signals or power switching approaches may be used.

Figure 14:
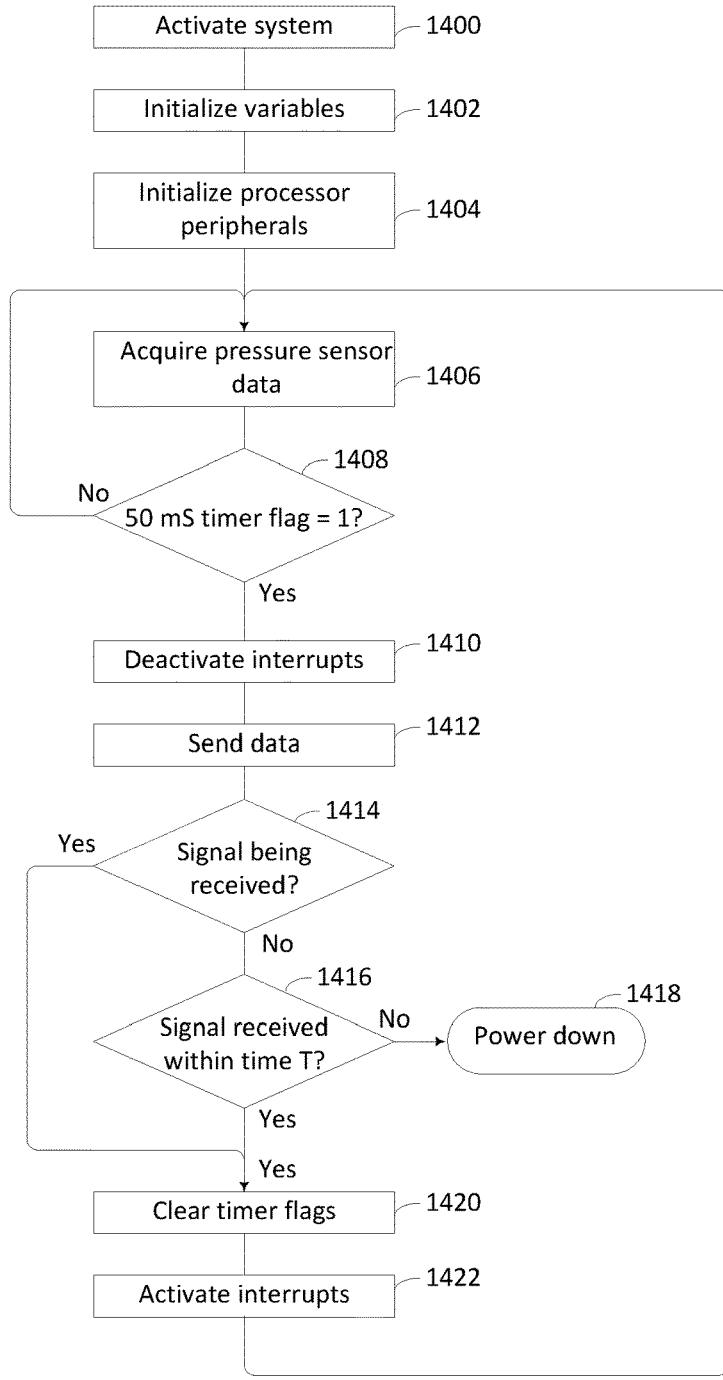
FIG. 14 is a flow chart of functions of the slave boot sensor unit of the sports monitoring system of FIG. 1.
Figure 15:
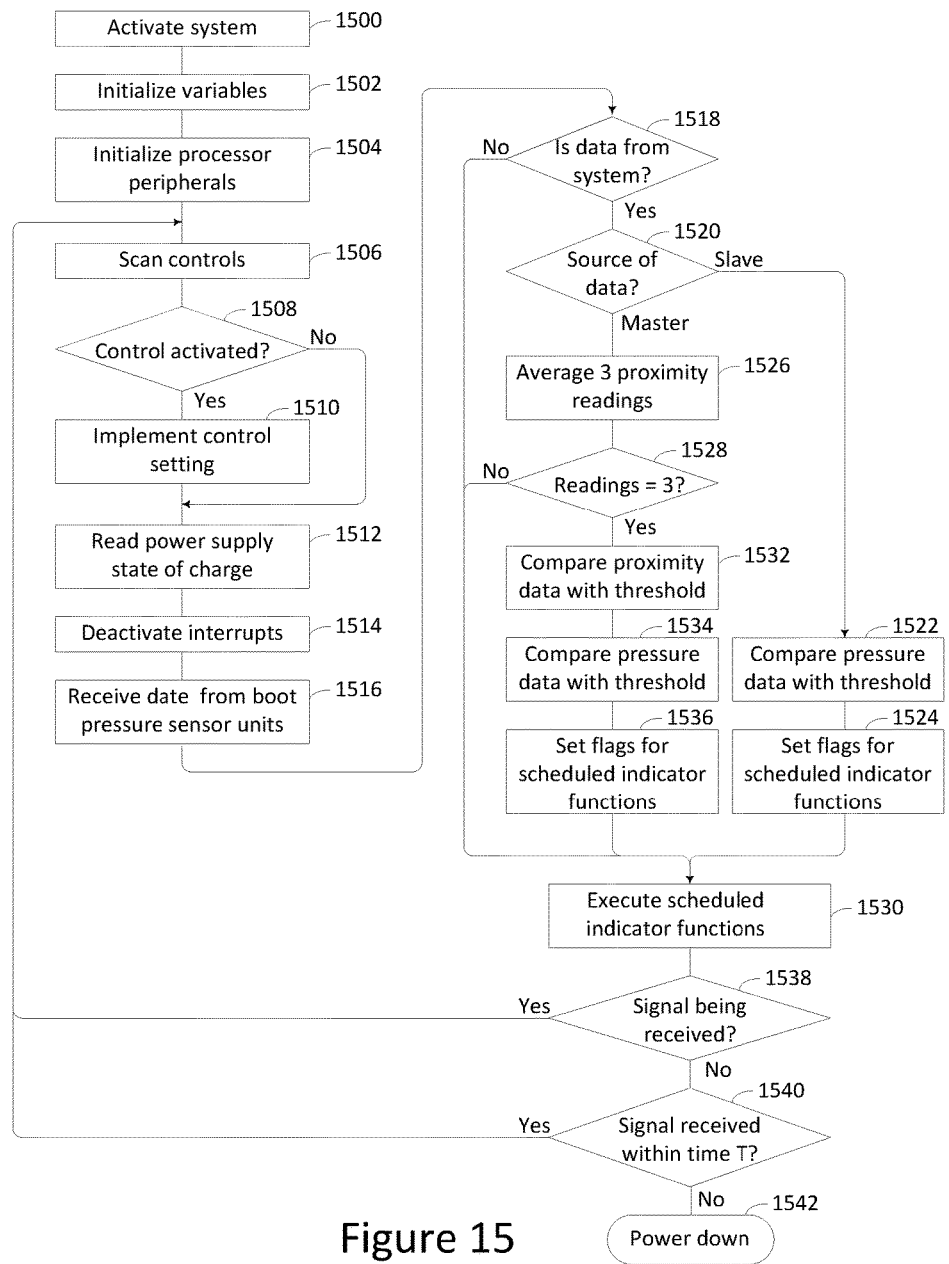
FIG. 15 is a flow chart of functions of the controller of the sports monitoring system of FIG. 1.

FIG. 14 illustrates a slave boot sensor unit software process according to some embodiments. This process is similar to that described above with reference to FIG. 13 except that the slave unit does not acquire proximity data. When the system is activated (1400), firmware variables are initialized (1402) and processor peripherals are initialized (1404). The software associated with the slave boot sensor unit includes a 50 mS timer scheduling the execution of all peripheral functions including acquiring pressure sensor data (1406). If the timer flag has not been set (1408), the data acquisition cycle loops for a defined period of time, in this embodiment 50 mS. If that period of time is exhausted, interrupts are deactivated (1410) and a loop (not shown) is entered in which the data are accumulated and in some embodiments may be averaged. Averaging serves as a mild recursive filtering function. The data are then communicated (1412) to the controller 24 for processing and event execution.

The controller 24 monitors and determines (1414) if the slave boot sensor unit is sending a signal. If a signal is currently being received, or has been received within a predetermined time T, the controller 24 remains powered on. If the controller 24 has not received any sensor signals in a predetermined amount of time T (1416), the controller 24 may power down (1418); in some embodiments T is approximately ten minutes but in other embodiments T could be more or less than that. If the controller is receiving a signal, the cycle is completed by clearing one or more timer flags (1420) and reactivating interrupts (1422). In other embodiments, other signals or power switching approaches may be used.

For convenience in explanation, in this embodiment the functions described in FIGS. 13 and 14 are all described separately, and in a context that the controller 24 performs some or all of these functions. In other embodiments some or all of these functions may be performed in the boot sensor units. In embodiments in which all functions are performed in the boot sensor units, the controller 24 may serve only as a control panel, sending control inputs to one of the boot sensor units for all processing and receiving from the sensor unit activation signals for visual indicators. Or the controller 24 may be omitted entirely and control functions may be performed through wireless communication with a cellphone or other similar device. A signal from one boot pressure sensor may be sufficient for the process to run, or the system may power down unless both boot pressure sensors provide signals within the time T.

If proximity detection is not used, the system may use an asynchronous operating mode whereby both the boot pressure sensor units transmit every 50 mS more or less.

15 illustrates a controller software process according to some embodiments. When the system is activated (1500), firmware variables are initialized (1502) and processor peripherals are initialized (1504). Once initialization is complete, the keypad is scanned for the occurrence of any activity (1506). If it is determined that there is keypad activity indicating a function should be performed (1508), the controller evaluates the state of the associated variables indicating what functions should be scheduled (1510). For example, if there is a state indicating a volume change has occurred, the value is assessed and the volume adjustment function is scheduled. If there is a state indicating the activation state of the unit has changed, it is assessed and the apparatus is either powered on or powered off. If there is an indication that the pressure threshold state has changed, the event is scheduled and the pressure threshold set accordingly when the event is executed. If there is an indication that the proximity threshold should be changed, the event is scheduled and the proximity threshold is set accordingly when the event is executed.

Once any functions initiated by keyboard activity are scheduled, the state of the battery charge is determined and reported to the user (1512). Interrupts are deactivated to avoid disruptions during receipt of transmission that might otherwise compromise the data being received (1514). As the data is received from one or more boot sensor units (1516), the Mac data structures are parsed for analysis.

The Mac data structure is parsed and the system level MAC ID value is evaluated. If it is determined that the data originated from the same system (1518), then the local device MAC ID value is assessed to determine which component in the system was the source of the data (1520). Otherwise, scheduled indicator functions are executed (1530).

If the local MAC ID indicates the source of the data was the secondary boot sensor unit, the data is compared to the pressure threshold reference point as discussed previously (1522), and the response flags for any required scheduled user indicator functions are set (1524). Then scheduled indicator functions are executed (1530).

If it is determined that the source of the data is the master boot sensor unit, one or more additional processes are invoked to receive, process and analyze the RSSI data. The payload RSSI data for three consecutive readings are averaged and compared to the threshold reference point (1526).

If less than three readings are received (1528), scheduled indicator functions are executed (1530). Otherwise, received pressure data are compared with threshold levels (1534), received RSSI data are compared with threshold levels (1532), and response flags for any required scheduled user indicator functions are set (1536). Then scheduled indicator functions are executed (1530).

After scheduled indicator functions are executed (1530), if a signal is being received the keypad is again scanned (1538). Or if a signal is received within a predetermined time T, the keypad is again scanned (1540). Otherwise power-down occurs (1542).

With reference to all of the figures above, a method for monitoring pressure of limbs or portions of limbs against pieces of equipment and the proximity of the respective limbs or portions of limbs, followed by instantaneous feedback to the user with respect to the status of pressure and proximity thresholds is described. The example used to illustrate this embodiment will be that of a ski training device used in conjunction with ski boots, but applications to other sports and activities are also suggested, such as use with boarding boots, motorcycle boots, water skiing boots, wake boarding boots, and other boots.

Figure 17:
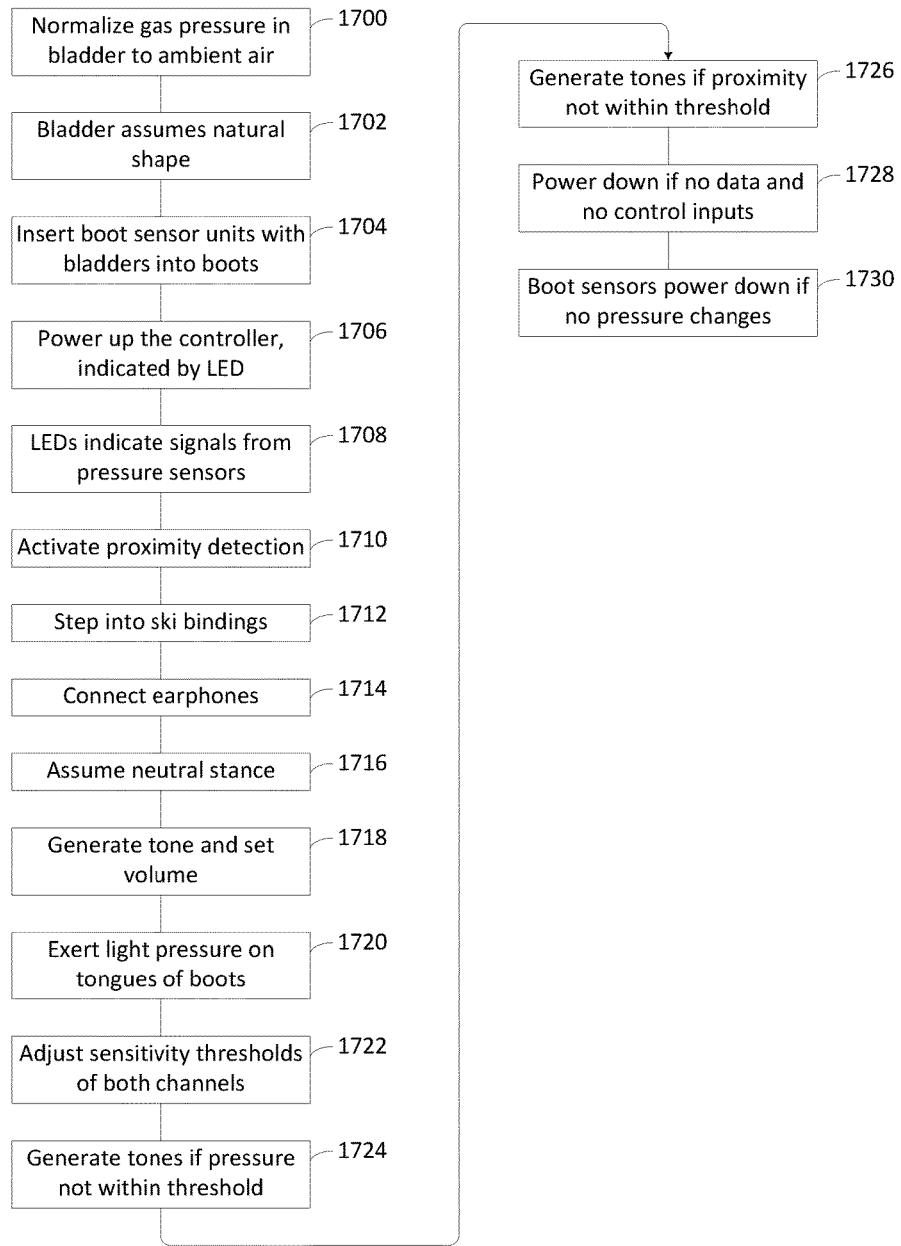
FIG. 17 is a flowchart of a method of monitoring pressure and proximity.

Referring to FIG. 17, in a first step of an exemplary embodiment wherein a gas-filled pressure sensor is used, the gas pressure in the bladder is normalized to the ambient air pressure (1700).

In a next step, the gas-filled bladder assumes its natural shape (1702).

In a next step, the boot sensor units are inserted into the corresponding right or left ski boot such that the bottom of the boot sensor unit casing rests within the area one inch directly above the upper most point of the boot tongue (1704).

In a next step, the controller is activated. An LED blinks continuously, or at a one second interval, indicating that the controller is powered on (1706). A second LED on the controller indicates that a transmission is being received from a first pressure sensor (1708). A third LED on the controller indicates that a transmission is being received from a second pressure sensor.

In a next step, proximity detection is activated by toggling an activation switch on the controller (1710). Alternatively, other switching mechanisms may be used, such as pressing and holding two of the pressure adjustment buttons simultaneously for a set duration of time.

In a next step, the skier attaches a pair of skis to the skier's boots (1712).

In a next step, the skier inserts a device capable of generating stereo sound into the stereo jack on the wireless controller (1714).

In a next step, the skier is to assume an erect posture and neutral stance where there is no pressure against gas filled bladder inserted into the ski boot (1716).

In a next step, a soft tone is generated on the left and the right stereo channels. Tone volume for the right channel may be adjusted to a desired level through the use of one or more buttons on the controller. Tone volume for the left channel may be adjusted to a desired level through the use of one or more buttons on the on the controller (1718).

In a next step, the skier may lean in the skis to a sufficient degree to create a light pressure against the gas-filled bladder (1720).

In a next step, the skier may adjust the sensitivity threshold for the right channel to a setting immediately beyond the point where the tone stops in the right ear (1722, 1724).

In a next step, the skier may adjust the sensitivity threshold for the left channel to a setting immediately beyond the point where the tone stops in the left ear (1722, 1724).

In a next step, the wireless controller powers down in a set number of minutes if either the wireless controller does not receive a stream of pressure data or if there is no transmission received (1728).

In a next step, the boot sensor may powers down in a set number of minutes if there is no detectable change in pressure (1730).

In a next step, a distinct tone is generated on one or more channels if the proximity of the boot sensor unit is outside a range associated with a proximity reference point (1726).

Also, contemplated herein are methods for connecting various components of a sport-boot pressure monitoring apparatus. The methods thus encompass the steps inherent in the above described mechanical structures and operation thereof.

Some embodiments include saving a log of one or more of pressure values, proximity values, and set points at time intervals over a predetermined time period. The saved information may be formatted into a downloadable file that can be communicated to a mobile phone such as an Apple iPhone or other device for contemporaneous or later review. The time period may be set by the user ahead of time or while engaged in monitoring pressure or proximity, or the time period may be predetermined in advance. For example, the method may include automatically saving the log over a ten-minute period and then storing it in memory or downloading it to another device.

Proximity of the boots to each other is determined in some embodiments by measuring the strength of an RF signal or other signal transmitted from one boot to the other, for example from the left to the right. In other embodiments, each boot transmits a signal to the other, the strengths of both received signals are measured, and the results are averaged to give the proximity of the boots to each other. The systems and methods disclosed herein can perform either kind of proximity measurement as desired.

In some embodiments, pressure of the leg against the tongue or other front part of the boot is measured. A signal is provided to the user indicating whether the pressure is absent or present, either by giving an audible or visual alert if the pressure is present, or by giving the alert if the pressure is absent. In other embodiments, pressure of the leg against the back of the boot is measured and similar alerts are given. The control unit 24 may be provided with one or more buttons or other switches to change from one indication to another, and the software 114 can include suitable instructions for the processor 101 to provide the desired output signal as selected by the user in the control unit 24.

Similarly, the amount of pressure that will generate an alert can be varied by the user by means of a button or other switch on the control unit 24.

Some embodiments include saving a log of one or more of pressure values, proximity values, and set points at time intervals over a predetermined time period. The saved information may be formatted into a downloadable file that can be communicated to a mobile phone such as an Apple iPhone or other device for contemporaneous or later review. The time period may be set by the user ahead of time or while engaged in monitoring pressure or proximity, or the time period may be predetermined in advance. For example, the method may include automatically saving the log over a ten-minute period and then storing it in memory or downloading it to another device.

In some embodiments, pressure of the leg against the tongue or other front part of the boot is measured. A signal is provided to the user indicating whether the pressure is absent or present, either by giving an audible or visual alert if the pressure is present, or by giving the alert if the pressure is absent. In other embodiments, pressure of the leg against the back of the boot is measured and similar alerts are given. The control unit 24 may be provided with one or more buttons or other switches to change from one indication to another, and the software 114 can include suitable instructions for the processor 101 to provide the desired output signal as selected by the user in the control unit 24. Similarly, the amount of pressure that will generate an alert can be varied by the user by means of a button or other switch on the control unit 24.

Figure 16:
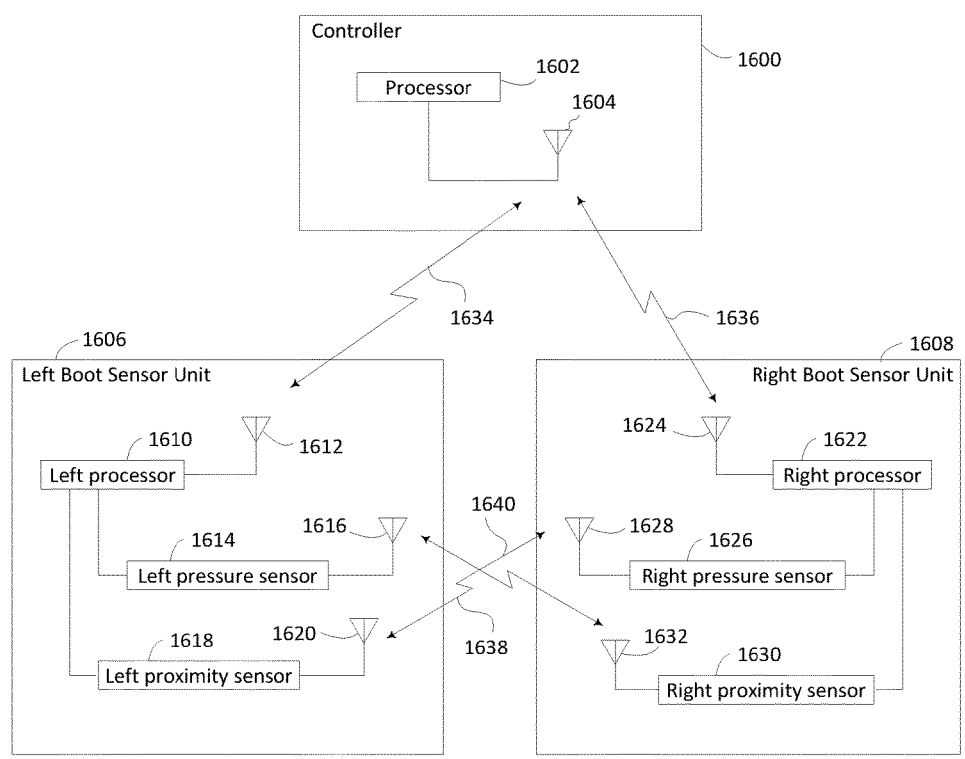
FIG. 16 is a diagram of another embodiment of a sports monitoring system, showing communication links between a controller and two boot sensor units.

FIG. 16 illustrates another embodiment of left and right boot sensors that include a proximity adjuster. In some respects this embodiment is similar to the one illustrated in FIG. 11 and described above. A controller 1600 includes a processor 1602 and an antenna 1604. A left boot sensor unit 1606 includes a processor 1610 with a transmitter antenna 1612, a pressure sensor 1614 with a transmitter antenna 1616, and a proximity detector 1618 with a receiver antenna 1620. A right boot sensor unit 1608 includes a processor 1622 with a transmitter antenna 1624, a pressure sensor 1626 with a transmitter antenna 1628, and a proximity detector 1630 with a receiver antenna 1632. The left and right boot sensor units 1606 and 1608 communicate wirelessly with the controller 1600 as indicated by communication links 1634 and 1636, respectively.

The left boot pressure sensor 1614 communicates with the right boot proximity sensor 1630, which may be a receiver, as indicated by a communication link. Similarly, the right boot pressure sensor 1626 communicates with the left boot proximity sensor 1618 as indicated by a communication link 1638, 1640.

In operation, either sensor unit may operate as a "master" and the other as a "secondary" or a "slave", or the two may be co-equal. The left proximity sensor 1618 provides a signal indicative of the proximity of one boot to the other, for example by measuring the strength of the signal it receives from the right pressure sensor 1626. Similarly the right proximity sensor 1630 provides a signal indicative of the proximity of one boot to the other, for example by measuring the strength of the signal it receives from the left pressure sensor 1614. These two proximity signals may be averaged to provide a final proximity measure, or either of them may be used by itself to provide a proximity measure. The averaging of the two signals may be carried out in hardware or by any of the controllers under software instructions. The right and left pressure sensor outputs can be communicated from one sensor unit to the other, or from each sensor unit to the controller.

While certain embodiments and details have been included herein for purposes of illustrating aspects of the instant disclosure, various changes in systems, apparatus, and methods disclosed herein may be made without departing from the scope of the instant disclosure.

The invention claimed is:

1. A sport-boot pressure monitoring process comprising:
   providing a first pressure alert if pressure between one of the user's legs and a boot worn on that leg violates a predetermined pressure threshold; and
   providing a proximity alert if distance between that boot and boot worn on the user's other leg violates a predetermined proximity threshold.

2. The process of claim 1 wherein:
   providing a first pressure alert comprises sensing a first pressure between said one of the user's legs and an interior surface of the boot worn on that leg, and
   providing a proximity alert comprises sensing distance between the boot worn on said one of the user's legs and the boot worn on the user's other leg.

3. The process of claim 1 and further comprising providing a second pressure alert if pressure between the other of the user's legs and a boot worn on that leg violates the predetermined pressure threshold.

4. The process of claim 1 and further comprising providing a second pressure alert if pressure between the other of the user's legs and a boot worn on that leg violates a second predetermined pressure threshold.

5. The process of claim 1 wherein the first pressure alert comprises an audible tone.

6. The process of claim 5 wherein the proximity alert comprises an audible tone that differs from the audible tone of the first pressure alert.

* * * * *